(12) United States Patent
Kaga et al.

(10) Patent No.: US 8,691,708 B2
(45) Date of Patent: Apr. 8, 2014

(54) METHOD OF MANUFACTURING SEMICONDUCTOR DEVICE AND SUBSTRATE PROCESSING APPARATUS

(75) Inventors: Yukinao Kaga, Toyama (JP); Tatsuyuki Saito, Toyama (JP); Masanori Sakai, Toyama (JP); Takashi Yokogawa, Toyoma (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/012,320

(22) Filed: Jan. 24, 2011

(65) Prior Publication Data

US 2011/0183519 A1 Jul. 28, 2011

(30) Foreign Application Priority Data

Jan. 25, 2010 (JP) .................................. 2010-013014
Nov. 30, 2010 (JP) .................................. 2010-266422

(51) Int. Cl.
*H01L 21/31* (2006.01)
(52) U.S. Cl.
USPC .......................................... 438/761; 438/785
(58) Field of Classification Search
CPC ...... C23C 16/06; C23C 16/52; C23C 16/455; C23C 16/301
USPC .......................... 438/584, 680, 785, 652, 761; 257/E21.17, E21.241, 632, E21.487, 257/E21.478, E23.001; 118/715
See application file for complete search history.

(56) References Cited

U.S. PATENT DOCUMENTS

| | | | |
|---|---|---|---|
| 2004/0235191 A1 | 11/2004 | Hasegawa et al. | |
| 2005/0153573 A1 | 7/2005 | Okudaira et al. | |
| 2005/0287775 A1 | 12/2005 | Hasebe et al. | |
| 2006/0113578 A1* | 6/2006 | Chung et al. | 257/303 |
| 2006/0193980 A1* | 8/2006 | Hasegawa | 427/248.1 |
| 2008/0050523 A1 | 2/2008 | Kitazoe et al. | |
| 2009/0130331 A1 | 5/2009 | Asai et al. | |
| 2010/0151681 A1* | 6/2010 | Knapp et al. | 438/680 |

FOREIGN PATENT DOCUMENTS

| | | |
|---|---|---|
| JP | 2003-77864 A | 3/2003 |
| JP | 2005-203502 A | 7/2005 |
| JP | 2006-049809 A | 2/2006 |
| KR | 1020010097163 A | 11/2001 |
| KR | 100363088 | 12/2002 |

(Continued)

OTHER PUBLICATIONS

In-Sang Jeon, KR2001-0097163 "Method of manufacturing barrier metal layer using atomic layer deposition method" (Nov. 8, 2001), Machine English Translation.*

*Primary Examiner* — Khiem D Nguyen
(74) *Attorney, Agent, or Firm* — Volpe And Koenig, P.C.

(57) ABSTRACT

A method of manufacturing a semiconductor device and a substrate processing apparatus capable of providing a TiN film at a higher film-forming rate. The method includes loading a substrate into a processing chamber; simultaneously starting a supply of a first processing gas and a second processing gas to form a film on the substrate, simultaneously stopping the supply of the first and second processing gas; removing the remaining first and second processing gas from the processing chamber; supplying the second processing gas into the processing chamber without supplying the first processing gas; removing the second processing gas starting and then stopping a supply of the first processing gas into the processing chamber without supplying the second processing gas; removing the first processing gas; and unloading the substrate from the processing chamber.

9 Claims, 19 Drawing Sheets

(56) References Cited

FOREIGN PATENT DOCUMENTS

| | | |
|---|---|---|
| KR | 1020080003920 A | 1/2008 |
| WO | 2005/093809 A1 | 10/2005 |
| WO | 2007/020874 A1 | 2/2007 |

\* cited by examiner

# METHOD OF MANUFACTURING SEMICONDUCTOR DEVICE AND SUBSTRATE PROCESSING APPARATUS

CROSS-REFERENCE TO RELATED PATENT APPLICATION

This application claims priority to and the benefit of Japanese Patent Application No. 2010-013014 filed on Jan. 25, 2010 and Japanese Patent Application No. 2010-266422 filed on Nov. 30, 2010, the disclosures of which are incorporated herein by reference.

FIELD OF THE INVENTION

The present invention relates to a method of manufacturing a semiconductor device and a substrate processing apparatus, and more particularly, to a method of manufacturing a semiconductor device and a substrate processing apparatus wherein a metal film or a metal compound is formed on a substrate (a wafer) using a halogenated metal compound or an organometallic compound as a source.

DESCRIPTION OF THE RELATED ART

Methods of forming a predetermined film on a substrate include a chemical vapor deposition (CVD) method. The CVD method is a method of forming a film including elements included in source molecules as components on a substrate using a reaction of at least two sources in a gas phase or on a surface of the substrate. In addition, the CVD method includes an atomic layer deposition (ALD) method. The ALD method includes alternatively supplying at least two sources used for forming a film onto a substrate under predetermined film-forming conditions (temperature, time, etc), and adsorbing the sources in a unit of an atomic layer wherein the formation is controlled at an atomic layer level using a surface reaction. The substrate may be processed at a lower substrate temperature (processing temperature) compared to the conventional CVD method, and a thickness of a film to be formed may be controlled by the number of film-forming cycles. In addition, a titanium nitride (TiN) film as disclosed in Patent Document 1 may be, for example, used as a conductive film formed on the substrate. In addition, tantalum (Ta), aluminum (Al), tungsten (W), manganese (Mn) and nitrides thereof, titanium (Ti), etc. may be used as the conductive film. In addition, oxides and nitrides of hafnium (Hf), zirconium (Zr), Al, etc. may be, for example, used as an insulating film.
[Prior-art Document]
[Patent Document]
 [Patent Document 1]International Publication No.: 2007/020874

When the titanium nitride (TiN) film is formed on the substrate to be processed as the conductive film, a titanium tetrachloride ($TiCl_4$), for example, may be used as a Ti-containing source, and an ammonia ($NH_3$) may be used as a nitriding gas. A TiN continuous film generally shows a columnar structure, but when the TiN film is formed using only the CVD method, the TiN continuous film tends to grow randomly from the beginning to the end of the film formation compared to the ALD method, resulting in coarse crystal grains or a rough film surface. As a ratio of air gap in the film increases, the film density may be reduced, resulting in an increase in resistivity. Moreover, a concentration of a chlorine (Cl) in the film may be increased, the resistivity of a TiN film itself may be increased, or a gas may be discharged in a subsequent process after the formation of the TiN film, etc.

Particularly, it is known that, when a film-forming temperature is reduced to 300° C., a film grows in a thorn-like shape, and its properties such as a surface roughness and a film density may be significantly degraded.

Meanwhile, the TiN continuous film formed by the ALD method may have a smooth surface compared to the films formed by the CVD method, thereby obtaining the TiN film having a relatively low resistance. In addition, it is possible to ensure a good step coverage. On the other hand, since a film-forming speed is slow compared to the CVD method, it takes longer to obtain a film having a desired thickness, and a thermal budget of a substrate may be increased.

SUMMARY OF THE INVENTION

Therefore, it is an object of the present invention to solve above-described problems, and provide a method of manufacturing a semiconductor device and a substrate processing apparatus capable of providing a TiN film that is higher in quality than a TiN film formed by the conventional CVD method, at a higher film-forming speed, that is, with a higher productivity than the TiN film formed by the ALD method.

In order to solve the above problems, according to one embodiment of the present invention, there is provided a method of manufacturing a semiconductor device, including steps of: (a) loading a substrate into a processing chamber; (b) forming a predetermined film on the substrate by simultaneously supplying the first processing gas and the second processing gas into the processing chamber; (c) stopping the supply of the first processing gas and the second processing gas and removing the first processing gas and the second processing gas remaining in the processing chamber; (d) modifying the film formed on the substrate by supplying the second processing gas into the processing chamber after the step (c); and (e) unloading the substrate from the processing chamber, wherein, in the step (b), a time period for supplying the second processing gas into the processing chamber is longer than a time period for supplying the first processing gas into the processing chamber.

According to another embodiment of the present invention, there is provided a method of manufacturing a semiconductor device, including: (a) loading a substrate into a processing chamber; (b) simultaneously starting a supply of a first processing gas and a second processing gas into the processing chamber to form a film on the substrate and simultaneously stopping the supply of the first processing gas and the second processing gas; (c) removing the first processing gas and the second processing gas remaining after performing the step (b) from the processing chamber; (d) supplying the second processing gas into the processing chamber without supplying the first processing gas (e) removing the second processing gas remaining after performing the step (d) from the processing chamber; (f) starting and then stopping a supply of the first processing gas into the processing chamber without supplying the second processing gas; (g) removing the first processing gas remaining after performing the step (f) from the processing chamber; and (h) unloading the substrate from the processing chamber.

According to still another embodiment of the present invention, there is provided a method of manufacturing a semiconductor device, including: (a) loading a substrate into a processing chamber; (b) starting a supply of a first processing gas containing a first element into the processing chamber and stopping the supply of the first processing gas without supplying a second processing gas containing a second element; (c) removing the first processing gas remaining after performing the step (b) from the processing chamber; (d)

simultaneously starting a supply of the first processing gas and the second processing gas into the processing chamber and simultaneously stopping the supply of the first processing gas and the second processing gas to react the second processing gas with the first processing gas; (e) removing the first processing gas and the second processing gas remaining after performing the step (d) from the processing chamber; (f) supplying the second processing gas into the processing chamber without supplying the first processing gas; (g) removing the second processing gas remaining after performing the step (f) from the processing chamber; and (h) unloading the substrate from the processing chamber.

According to yet another embodiment of the present invention, there is provided a method of manufacturing a semiconductor device, including: (a) loading a substrate into a processing chamber; (b) supplying a first processing gas into the processing chamber; (c) supplying a second processing gas into the processing chamber while continuously supplying the first processing gas into the processing chamber; (d) stopping the supply of the first processing gas while continuously supplying the second processing gas; (e) stopping the supply of the second processing gas (f) removing the first processing gas and the second processing gas remaining after performing the step (e) from the processing chamber; and (g) unloading the substrate from the processing chamber, wherein the steps (b) through (f) are performed in order a predetermined number of times.

According to yet another embodiment of the present invention, there is provided a substrate processing apparatus including: a processing chamber for accommodating a substrate; a first processing gas supply means for supplying the first processing gas into the processing chamber; a second processing gas supply means for supplying the second processing gas into the processing chamber; an exhaust means for exhausting an inside of the processing chamber; and a control unit for controlling the first processing gas supply means, the second processing gas supply means, and the exhaust means to form a film on the substrate by simultaneously supplying the first processing gas and the second processing gas into the processing chamber, stopping the supply of the first processing gas and the second processing gas and exhausting the first processing gas and the second processing gas remaining in the processing chamber, and modifying the film formed on the substrate by supplying the second processing gas into the processing chamber, wherein, when the first processing gas and the second processing gas are simultaneously supplied into the processing chamber, the control unit controls the first processing gas supply means and the second processing gas supply means in a manner that a time period for supplying the second processing gas into the processing chamber is longer than a time period for supplying the first processing gas into the processing chamber.

According to the present invention, it is possible to provide a TiN film that is higher in quality than the TiN film formed by the conventional CVD method, at the higher film-forming rate, that is, with the higher productivity than the TiN film formed by the ALD method.

DETAILED DESCRIPTION OF THE PREFERRED EMBODIMENTS

Hereinafter, preferred embodiments of the present invention will now be described with reference to the accompanying drawings.

A substrate processing apparatus in accordance with an embodiment is one example of a semiconductor manufacturing apparatus used to manufacture semiconductor devices (integrated circuits (ICs)).

In the following description, a case where a vertical apparatus for performing a film-forming process on a substrate is exemplified as the substrate processing apparatus will be described. However, the present invention is not limited to the vertical apparatus, but a single-type apparatus may be, for example, used herein.

<Overall Configuration of Apparatus>

Figure 1:
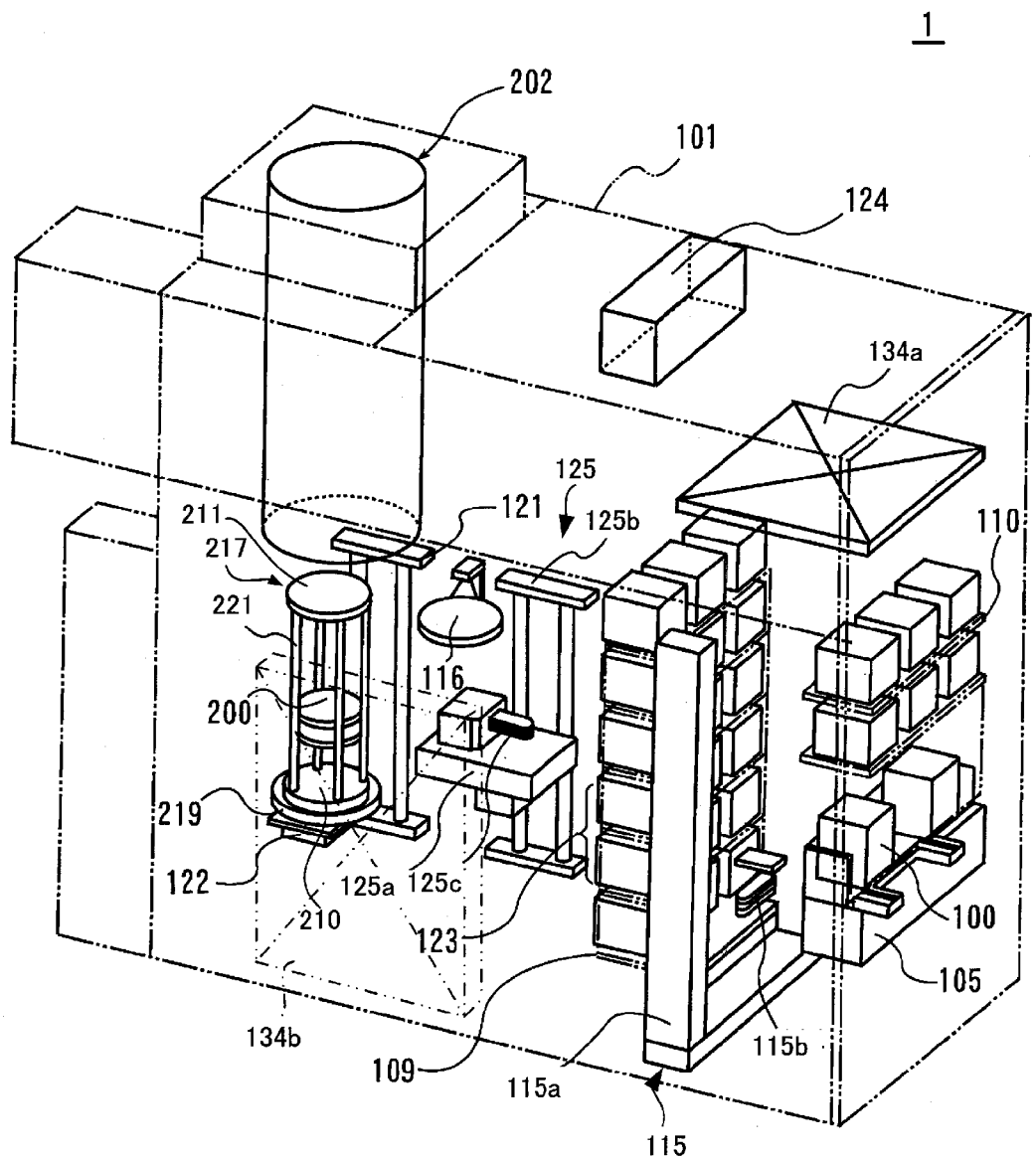
FIG. 1 is a perspective view schematically illustrating a schematic configuration of a substrate processing apparatus preferably used in one embodiment of the present invention.

As shown in FIG. 1, a cassette 100 for accommodating a wafer 200, which is an example of a substrate is used in a substrate processing apparatus 1. The wafer 200 is made of a material such as silicon. The substrate processing apparatus 1 includes a case 101, and a cassette stage 105 is installed inside the case 101. The cassette 100 is loaded onto the cassette stage 105 or unloaded from the cassette stage 105 using an in-process transfer device (not shown).

The cassette stage 105 is placed by the in-process transfer device such that a wafer entrance of the cassette 100 can be directed upward while the wafer 200 in the cassette 100 is held in a vertical posture. The cassette stage 105 is configured such that the cassette 100 is rotated 90° counterclockwise in a longitudinal direction of a back side of the case 101 to place the wafer 200 in the cassette 100 in a horizontal posture, and to direct the wafer entrance of the cassette 100 to the back side of the case 101.

A cassette shelf 109 is installed about a middle portion of the case 101 with respect to the backside and a front side thereof, and the cassette shelf 109 is configured to store a plurality of cassettes 100 in a plurality of columns and a plurality of rows.

A transfer shelf 123 into which the cassette 100 is to be transferred by a wafer transfer mechanism 125 is installed in the cassette shelf 109.

A spare cassette shelf 110 is installed above the cassette stage 105, and stores the cassette 100 in reserve.

A cassette transfer device 115 is installed between the cassette stage 105 and the cassette shelf 109. The cassette transfer device 115 is composed of a cassette elevator 115a capable of moving up and down while holding the cassette 100, and a cassette transfer mechanism 115b serving as a transfer mechanism. The cassette transfer device 115 is configured to transfer the cassette 100 among the cassette stage 105, the cassette shelf 109, and the spare cassette shelf 110 by a continuous operation of the cassette elevator 115a and the cassette transfer mechanism 115b.

A wafer transfer mechanism 125 is installed in the rear of the cassette shelf 109. The wafer transfer mechanism 125 is composed of a wafer transfer device 125a capable of rotating or linearly moving the wafer 200 in a horizontal direction, and a wafer transfer device elevator 125b for elevating the wafer transfer device 125a. Tweezers 125c for picking up the wafer 200 are installed in the wafer transfer device 125a. The wafer transfer mechanism 125 is configured to load (charge) the wafer 200 into a boat 217 or unload (discharge) the wafer 200 from the boat 217 by a continuous operation of the wafer transfer device 125a and the wafer transfer device elevator 125b using the tweezers 125c as a placing unit of the wafer 200.

A processing furnace 202 for thermally processing the wafer 200 is installed above the rear of the case 101, and a lower end of the processing furnace 202 is configured to be opened and closed by means of a furnace port shutter 116.

A boat elevator 121 for elevating the boat 217 with respect to the processing furnace 202 is installed below the processing furnace 202. An arm 122 is connected to an elevation stage of the boat elevator 121, and a seal cap 219 is horizontally installed in the arm 122. The seal cap 219 is configured to be able to vertically support the boat 217 and close the lower end of the processing furnace 202.

The boat 217 includes a plurality of holding members, and is configured to horizontally hold a plurality of (for example, approximately 50 to 150) wafers 200 in a state where the plurality of wafers 200 are arranged in a vertical direction from the center of the boat 217.

A cleaning unit 134a for supplying clean air having a cleaned atmosphere is installed above the cassette shelf 109. The cleaning unit 134a is composed of a supply fan and a dust-proof filter, and is configured to allow the clean air to flow inside the case 101.

A cleaning unit 134b for supplying clean air is installed in a left side end of the case 101. In addition, the cleaning unit 134b is composed of a supply fan and a dust-proof filter, and is configured to allow the clean air to flow around the wafer transfer device 125a and the boat 217. The clean air is intended to be exhausted out of the case 101 after it flows around the wafer transfer device 125a and the boat 217.

<Operation of Processing Apparatus>

Next, a main operation of the substrate processing apparatus 1 will be described.

When the cassette 100 is loaded onto the cassette stage 105 by means of the in-process transfer device (not shown), the cassette 100 is placed to hold the wafer 200 on the cassette stage 105 in a vertical posture, and direct the wafer entrance of the cassette 100 upward. Thereafter, the cassette 100 is rotated 90° counterclockwise in a longitudinal direction to the backward of the case 101 so that the wafer 200 in the cassette 100 can be in a horizontal posture, and the wafer entrance of the cassette 100 can be directed to the backward of the case 101 by the cassette stage 105.

Then, the cassette 100 is automatically transferred and placed to a preset shelf position of the cassette shelf 109 or the spare cassette shelf 110 by means of the cassette transfer device 115, temporarily stored, and transferred from the cassette shelf 100 or the spare cassette shelf 110 into the transfer shelf 123 by means of the cassette transfer device 115, or directly transferred into the transfer shelf 123.

When the cassette 100 is transferred to the transfer shelf 123, the wafer 200 is picked up from the cassette 100 via the wafer entrance by means of the tweezers 125c of the wafer transfer device 125a, and loaded (charged) into the boat 217. The wafer transfer device 125a placing the wafer 200 into the boat 217 returns to the cassette 100, and charges another wafer 200 into the boat 217.

When a preset number of wafers 200 are charged into the boat 217, the furnace port shutter 116 covering the lower end of the processing furnace 202 is opened, and the lower end of the processing furnace 202 is then opened. Thereafter, the boat 217 holding a group of the wafers 200 is loaded into the processing furnace 202 by an elevation operation of the boat elevator 121, and a lower portion of the processing furnace 202 is closed by the seal cap 219.

After the loading process, the wafers 200 are optionally processed in the processing furnace 202. After the optional processing, the wafers 200 and the cassette 100 are unloaded from the case 101 in reverse order as described above.

<Configuration of Processing Furnace>

Next, the processing furnace 202 applied to the above-described substrate processing apparatus will be described with reference to FIGS. 2 and 3.

Figure 2:
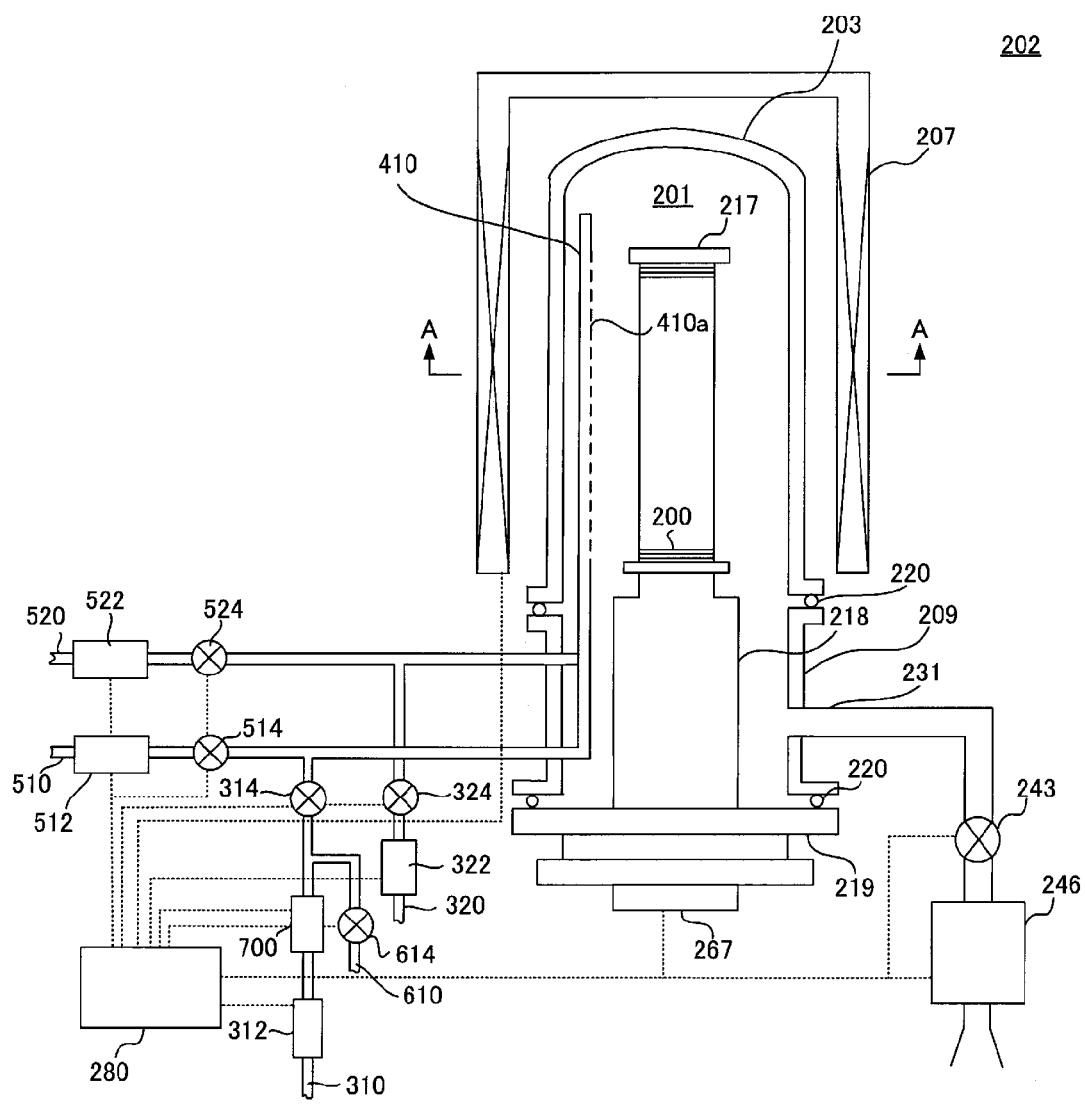
FIG. 2 is a configuration diagram schematically exemplifying a processing furnace and accompanying members thereof preferably used in one embodiment of the present invention, particularly a longitudinal cross-sectional view illustrating a part of the processing furnace.
Figure 3:
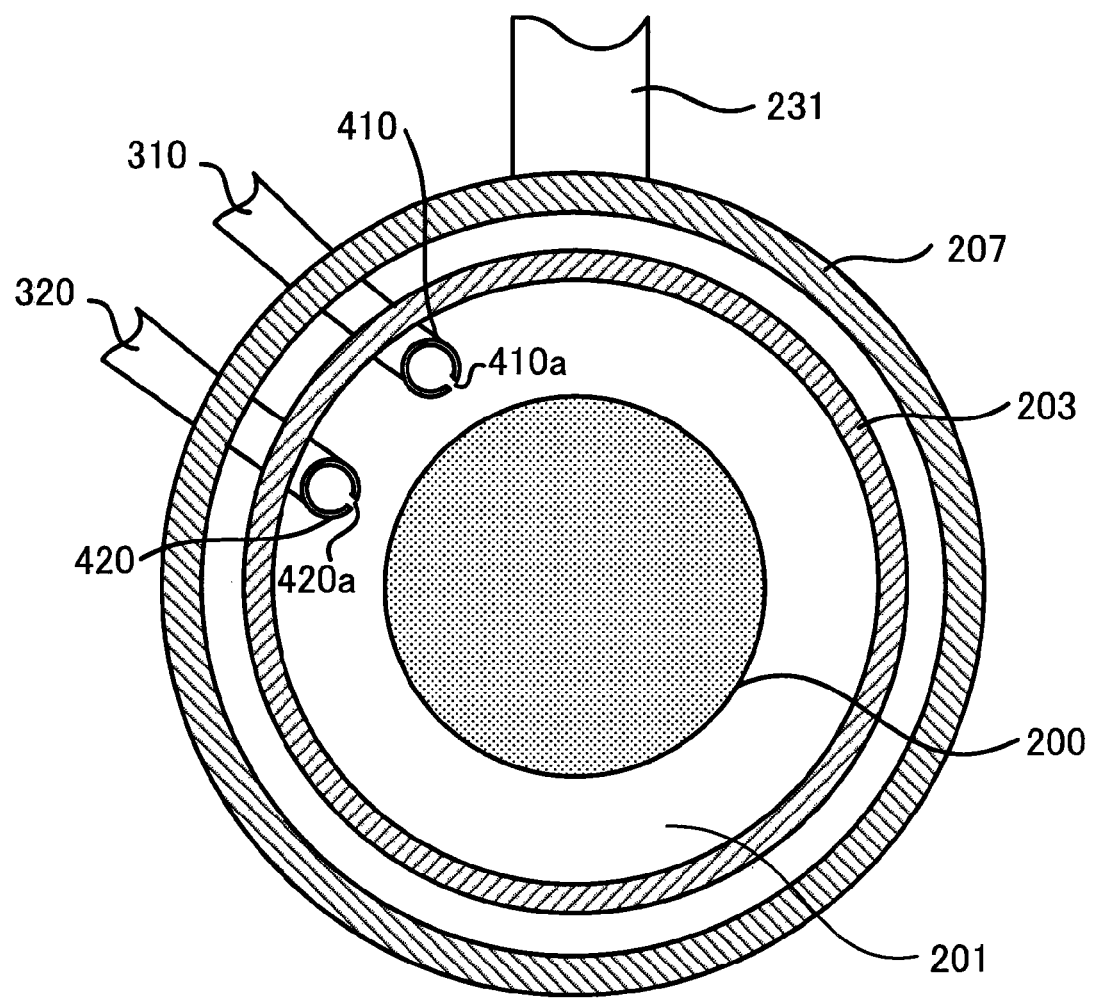
FIG. 3 is a cross-sectional view of the processing furnace shown in FIG. 2 taken along line A-A preferably used in one embodiment of the present invention.

As shown in FIGS. 2 and 3, a heater 207 that is a heating device (heating means) for heating the wafer 200 is installed in the processing furnace 202. The heater 207 includes a cylindrical heat insulating member having a closed top portion, and a plurality of heater wires, and has a unit configuration in which the heater wires are installed with respect to the heat insulating member. A reaction tube 203 made of quartz for processing the wafer 200 is installed inside the heater 207.

A manifold 209 made of stainless steel is installed in a lower end of the reaction tube 203 via an O-ring 220 serving as a sealing member. An opening in a lower end of the manifold 209 is air-tightly closed via the O-ring 220 by the seal cap 219 serving as a lid (cover). A processing chamber 201 is formed in the processing furnace 202 by at least the reaction tube 203, the manifold 209 and the seal cap 219.

A boat support 218 for supporting the boat 217 is installed in the seal cap 219. As shown in FIG. 1, the boat 217 includes a bottom plate 210 fixed to the boat support 218 and a top plate 211 arranged above the bottom plate 210, and has a configuration in which a plurality of posts 221 are installed between the bottom plate 210 and the top plate 211. A plurality of wafers 200 are held by the boat 217. The plurality of wafers 200 are supported by the post 221 of the boat 217 in a state where the wafers 200 are arranged at regular intervals and held in a horizontal posture.

In the above-described processing furnace 202, the boat 217 is inserted into the processing chamber 201 while being supported by the boat support 218 in a state where the plurality of wafers 200 to be batch-processed are stacked in multiple stages on the boat 217, and the heater 207 is configured to heat the wafer 200 inserted into the processing chamber 201 at a predetermined temperature.

As shown in FIGS. 2 and 3, a gas supply tube 310 (a first gas supply tube) for supplying a first processing gas serving as a source gas and a gas supply tube 320 (a second gas supply tube) for supplying a second processing gas serving as a modification gas are connected to the processing chamber 201.

A mass flow controller 312 serving as a mass flow control device (mass flow control means), an evaporator 700 serving as an evaporation unit (evaporation means) and a valve 314 serving as a switching valve are installed in the gas supply tube 310 in order from an upstream side thereof. A nozzle 410 (a first nozzle) is connected to a front end of the gas supply tube 310. The first nozzle 410 extends from an arc-shaped space, which is formed between the wafer 200 and an inner wall of the reaction tube 203 constituting the processing chamber 201, in up and down directions (a stacking direction of the wafers 200) along the inner wall of the reaction tube 203. A plurality of gas supply holes 410a for supplying the first processing gas are installed in a side surface of the first nozzle 410. The gas supply holes 410a have opening areas that are inclined or equal in size from the bottom to the top thereof, and are installed at the same opening pitch.

In addition, a vent line 610 and a valve 614 connected to an exhaust pipe 231 to be described later are installed between the evaporator 700 and the valve 314 in the gas supply tube 310. Therefore, when the first processing gas is not supplied into the processing chamber 201, the first processing gas is supplied into the vent line 610 via the valve 614.

In addition, a carrier gas supply tube 510 for supplying a carrier gas is connected to the gas supply tube 310. A mass flow controller 512 and a valve 514 are installed in the carrier gas supply tube 510.

A mass flow controller 322 serving as a mass flow control device (mass flow control means) and a valve 324 are installed in the gas supply tube 320 in order from an upstream side thereof. A nozzle 420 (a second nozzle) is connected to a front end of the gas supply tube 320. Similar to the first nozzle 410, the second nozzle 420 also extends from an arc-shaped space, which is formed between the wafer 200 and an inner wall of the reaction tube 203 constituting the processing chamber 201, in up and down directions (a stacking direction of the wafers 200) along the inner wall of the reaction tube 203. A plurality of gas supply holes 420a for supplying the second processing gas are installed in a side surface of the second nozzle 420. Similar to the gas supply holes 410a, the gas supply holes 420a have opening areas that are inclined or equal in size from the bottom to the top thereof, and are installed at the same opening pitch.

In addition, a carrier gas supply tube 520 for supplying a carrier gas is connected to the gas supply tube 320. A mass flow controller 522 and a valve 524 are installed in the carrier gas supply tube 520.

For example, when a first processing gas source supplied from the gas supply tube 310 is in a liquid state, a first processing gas serving as a reactive gas is supplied via the first nozzle 410 into the processing chamber 201 from the gas supply tube 310 which is linked with the carrier gas supply tube 510 via the mass flow controller 312, the evaporator 700, and the valve 314. For example, when a source supplied from the gas supply tube 310 is in a gaseous state, the mass flow controller 312 is exchanged with a gas mass flow controller, and the use of the evaporator 700 is not necessary. In addition, a second processing gas serving as a modification gas is supplied via the second nozzle 420 into the processing chamber 201 from the gas supply tube 310 which is linked with the carrier gas supply tube 520 via the mass flow controller 322 and the valve 324.

As one example of the configuration, a Ti source such as titanium tetrachloride ($TiCl_4$), tetrakisdimethylaminotitanium (TDMAT, $Ti[N(CH_3)_2]_4$) or tetrakisdiethylaminotitanium (TDEAT, $Ti[N(CH_2CH_3)_2]_4$) is introduced as one example of the first processing gas into the gas supply tube 310. A nitride source such as ammonia ($NH_3$), nitrogen ($N_2$), nitrous oxide ($N_2O$) or monomethylhydrazine ($CH_6N_2$) is introduced as one example of the second processing gas into the gas supply tube 320.

An exhaust pipe 231 for exhausting an inside of the processing chamber 201 via a valve 243 is connected to the processing chamber 201. A vacuum pump 246 serving as an exhaust device (exhaust means) is connected to the exhaust pipe 231, and is configured to be able to vacuum-exhaust the inside of the processing chamber 201 by action of the vacuum pump 246. The valve 243 is a switching valve that can start and stop the vacuum exhaust of the processing chamber 201 by means of a switching operation, and control an opening level of the valve to adjust an inner pressure of the processing chamber 201 as well.

A boat 217 is installed in a central region in the reaction tube 203. The boat 217 is configured to be able to move up and down (go in and out) with respect to the reaction tube 203 by means of the boat elevator 121. A boat rotation mechanism 267 for rotating the boat 217 to improve processing uniformity is installed in a lower end of the boat support 218 configured to support the boat 217. The boat 217 supported by the boat support 218 may be rotated by driving the boat rotation mechanism 267.

Each of the above-described members such as the mass flow controllers 312, 322, 512 and 522, the valves 314, 324, 514, 524, 243 and 614, the heater 207, the vacuum pump 246, the boat rotation mechanism 267 and the boat elevator 121 is connected to a controller 280. The controller 280 is one example of a control unit (control means) for controlling the whole operation of the substrate processing apparatus 1, and is configured to control adjustment of a flow rate of the mass flow controllers 312, 322, 512 and 522, a switching operation of the valves 314, 324, 514, 524 and 614, switching and pressure-adjustment operations of the valve 243, adjustment of a temperature of the heater 207, start and stop of the vacuum pump 246, adjustment of a rotary speed of the boat rotation mechanism 267, an elevating operation of the boat elevator 121, etc.

<Method of Manufacturing Semiconductor Device>

Next, as one of processes of manufacturing a semiconductor device, a method of forming an insulation film on a substrate using the processing furnace 202 of the above-described substrate processing apparatus during a manufacturing of a large scale integration (LSI) IC will be described.

In addition, in the following description, an operation of each of the parts constituting the substrate processing apparatus is controlled by the controller 280.

As a method of forming a TiN film as a conductive film on a substrate, an example wherein the $TiCl_4$ is used as a titanium-containing source which is a first processing gas and the $NH_3$ is used as a nitriding gas which is a second processing gas will be described.

First, an example wherein a film is formed by a CVD method through a process in which one cycle of the film-forming sequence is composed of one pulse of the Ti source and two or more pulses of the N source will be described.

[First Embodiment]

Figure 4:
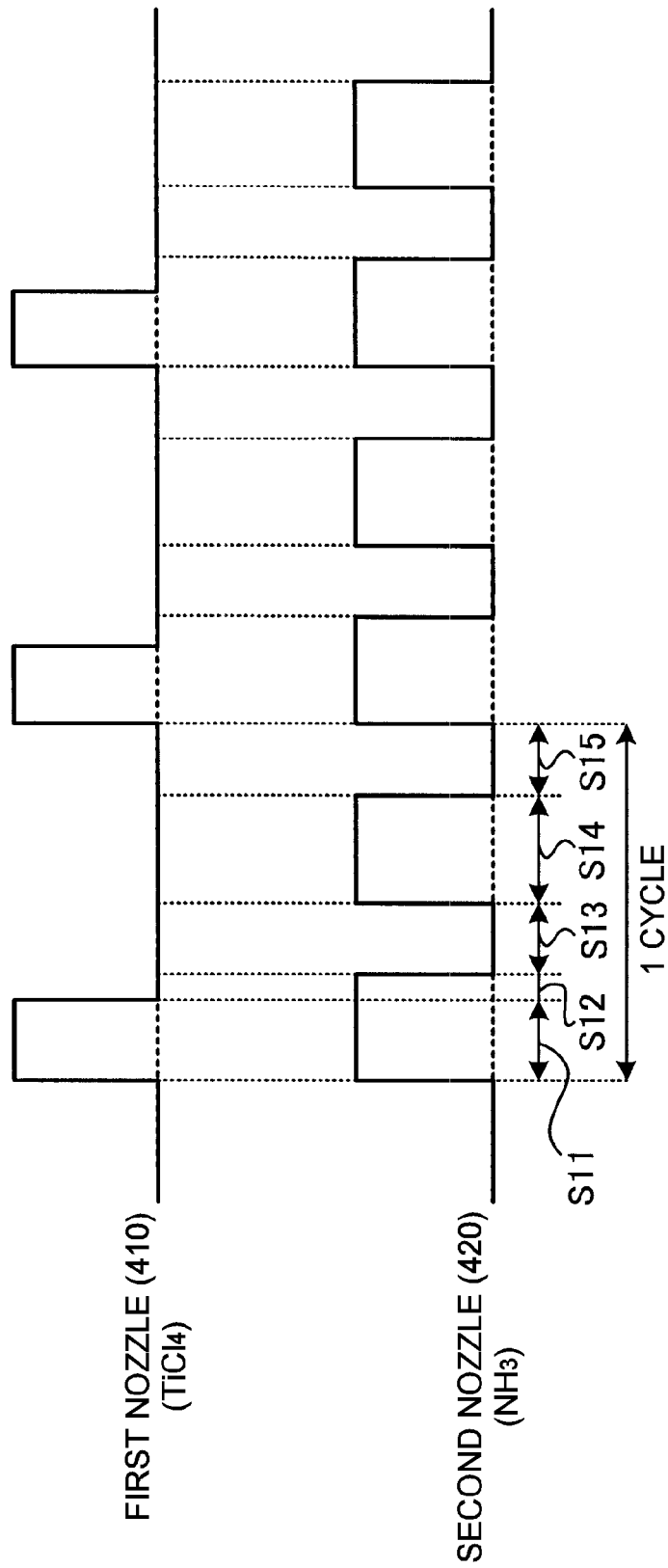
FIG. 4 is a diagram illustrating a film-forming sequence in accordance with a first embodiment of the present invention.
Figure 5:
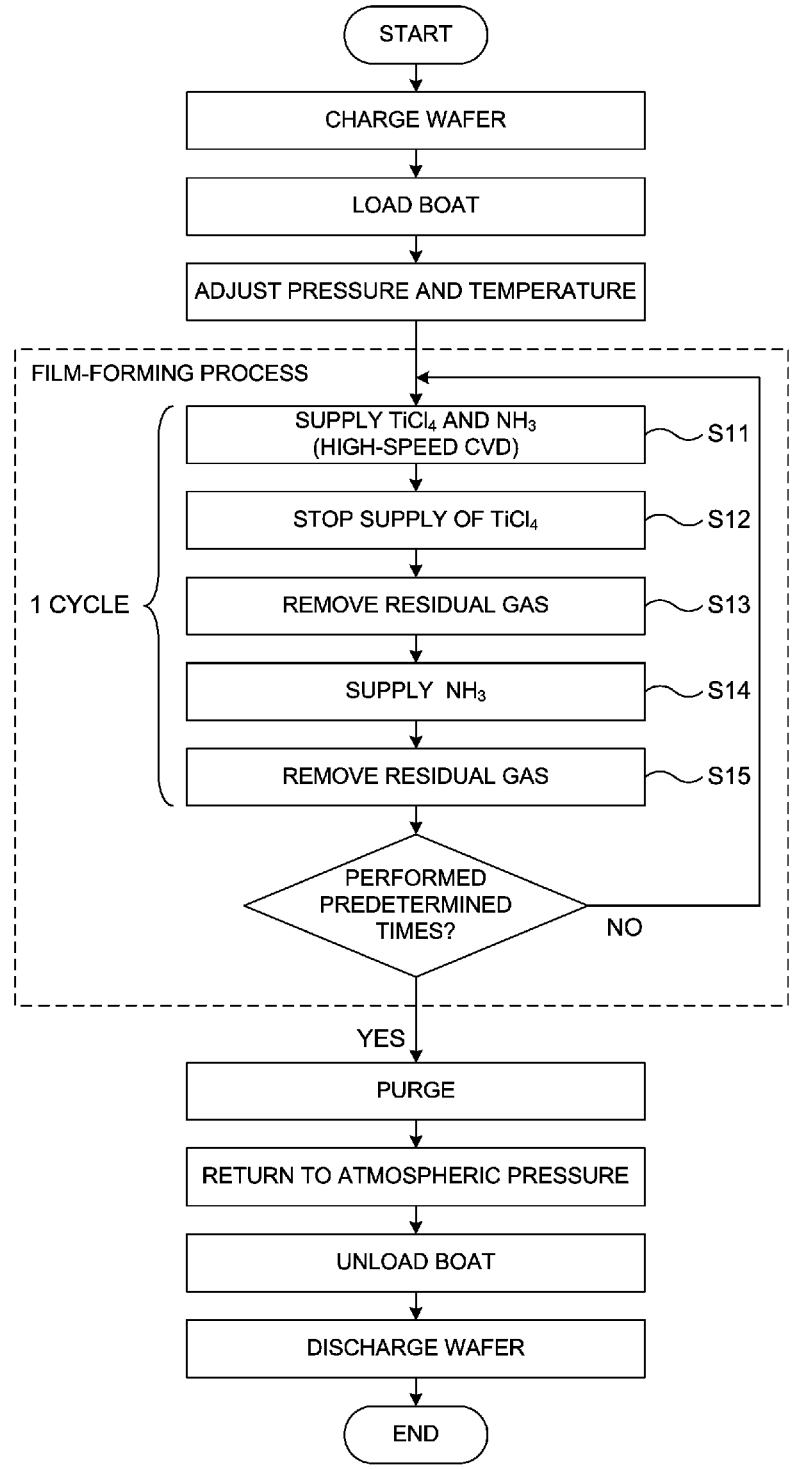
FIG. 5 is a flow diagram illustrating a process in accordance with a first embodiment of the present invention.

FIG. 4 illustrates a film-forming sequence of a TiN film according to a first embodiment. In addition, FIG. 5 is a flow diagram illustrating a process in accordance with the first embodiment.

In the film-forming process, the controller 280 controls the substrate processing apparatus 1 in a following manner. That is, the heater 207 maintains a temperature of the processing chamber 201 at which a CVD reaction occurs, for example, within a range of 250° C. to 800° C., preferably 700° C. or less, and more preferably 450° C. Thereafter, the plurality of wafers 200 are charged into the boat 217, and the boat 217 is loaded into the processing chamber 201. Subsequently, the boat 217 is rotated by the boat drive mechanism 267 to rotate the wafers 200. Thereafter, the valve 243 is opened and the vacuum pump 246 is operated to evacuate the inside of the processing chamber 201. When a temperature of the wafers 200 reaches 450° C. and the temperature is stabilized, a sequence to be described later is performed with the temperature of the processing chamber 201 being maintained at 450° C.

For a deposition of a TiN film by the CVD method, the controller 280 controls valves, mass flow controllers and a vacuum pump to supply the $TiCl_4$ and the $NH_3$ into the processing chamber 201 such that both the $TiCl_4$ and the $NH_3$ are present in the processing chamber 201 during a certain time period to cause a gas phase reaction (CVD reaction). Hereinafter, the film-forming sequence will now be described in detail.

The $TiCl_4$ is in a liquid state at room temperature. While the $TiCl_4$ may be gasified by heating and supplied into the processing chamber 201 or the $TiCl_4$ may be supplied into the processing chamber 201 by passing an inert gas (referred to as a carrier gas) such as helium (He), neon (Ne), argon (Ar) and nitrogen ($N_2$) through a the $TiCl_4$ container using the evaporator 700 and supplying the evaporated the $TiCl_4$ along with the carrier gas into the processing chamber 201, the latter will be exemplified.

In the sequence, a step of simultaneously flowing the $TiCl_4$ and the $NH_3$ is performed.

Since the CVD reaction occurs between the first processing gas, for example, the $TiCl_4$, and the second processing gas, for example, the $NH_3$, by supplying the first processing gas and the second processing gas simultaneously, a higher film-forming rate may be achieved compared to an ALD reaction. More particularly, the $TiCl_4$ is introduced into the gas supply tube 310, and the carrier gas ($N_2$) is introduced into the carrier gas supply tube 510. The valve 314 of the gas supply tube 310, the valve 514 of the carrier gas supply tube 510, and the valve 243 of the exhaust pipe 231 are opened. The carrier gas flows from the carrier gas supply tube 510, and a flow rate thereof is then adjusted by the mass flow controller 512. The $TiCl_4$ flows from the gas supply tube 310, and a flow rate thereof is then adjusted by the mass flow controller 312. The $TiCl_4$ is evaporated by the evaporator 700, mixed with the flow rate-controlled carrier gas, and supplied from the gas supply hole 410a of the first nozzle 410 into the processing chamber 201.

In addition, the $NH_3$ is introduced into the gas supply tube 320, and a carrier gas ($N_2$) is introduced into the carrier gas supply tube 520. The valve 324 of the gas supply tube 320, the valve 524 of the carrier gas supply tube 520 and the valve 243 of the exhaust pipe 231 are opened. The carrier gas flows from the carrier gas supply tube 520, and a flow rate thereof is then adjusted by the mass flow controller 522. The $NH_3$ flows from the gas supply tube 320, and a flow rate thereof is then adjusted by the mass flow controller 322, mixed with the flow rate-controlled carrier gas, and supplied from the gas supply hole 420a of the second nozzle 420 into the processing chamber 201.

In addition, the $TiCl_4$ and the $NH_3$ supplied into the processing chamber 201 are exhausted through the exhaust pipe 231. In this case, an opening level of the valve 243 is suitably adjusted to maintain the inner pressure of the processing chamber 201 within a range of 5 to 50 Pa, for example, 20 Pa. A supply quantity of the $TiCl_4$ controlled by the mass flow controller 312 ranges from 0.8 to 3.0 g/min. A supply quantity of the $NH_3$ controlled by the mass flow controller 322 ranges from 0.3 to 15 slm. The wafer 200 is exposed to the $TiCl_4$ and the $NH_3$ until a film reaches a desired thickness. In this case, a temperature of the heater 207 is set such that a temperature of the wafer 200 ranges from 250° C. to 800° C., for example, 450° C. In addition, when the temperature of the wafer 200 is, for example, less than 250° C., a reaction speed of the $TiCl_4$ and the $NH_3$ is slow. Therefore, obtaining the film having the desired thickness within a predetermined time period is difficult, and the practical industrial use of the film is also impossible. Accordingly, the temperature of the wafer 200 preferably ranges from 300° C. to 500° C. to sufficiently induce the CVD reaction at a high speed.

(Step S11)

In step S11, in order to form the TiN film on a substrate using a high-speed CVD method, the $TiCl_4$ is supplied through the first nozzle 410, and the $NH_3$ is supplied together with the $TiCl_4$ through the second nozzle 420. The $TiCl_4$ is introduced into the gas supply tube 310, the $NH_3$ is introduced into the gas supply tube 320, and the carrier gas ($N_2$) is introduced into the carrier gas supply tubes 510 and 520. The valves 314 and 324 of the gas supply tube 310 and 320, the valves 514 and 524 of the carrier gas supply tubes 510 and 520, and the valve 243 of the exhaust pipe 231 are opened together. The carrier gas flows from the carrier gas supply tubes 510 and 520, and a flow rate thereof is then adjusted by the mass flow controllers 512 and 522. The $TiCl_4$ flows from the gas supply tube 310, and the flow rate thereof is then adjusted by the mass flow controller 312. The $TiCl_4$ is evaporated by the evaporator 700, mixed with the flow rate-controlled carrier gas, and exhausted from the exhaust pipe 231 while being supplied from the gas supply hole 410a of the first nozzle 410 into the processing chamber 201. The $NH_3$ flows from the gas supply tube 320, and the flow rate thereof is then adjusted by the mass flow controller 322. The $NH_3$ is mixed with the flow rate-controlled carrier gas, and exhausted from the exhaust pipe 231 while being supplied from the gas supply hole 420a of the second nozzle 420 into the processing chamber 201.

In this case, the opening level of the valve 243 is suitably adjusted to maintain the inner pressure of the processing chamber 201 within a range of 20 to 50 Pa, for example, 30 Pa. A supply quantity of the $TiCl_4$ controlled by the mass flow controller 312 is, for example, ranges from 0.8 to 1.5 g/min. In addition, a supply flow rate of the $NH_3$ controlled by the mass flow controller 322 ranges, for example, from 5.0 to 8.0 slm. A time period during which the wafer 200 is exposed to the $TiCl_4$ and the $NH_3$ ranges, for example, from 5 to 30 seconds.

In this case, a gas flowing into the processing chamber 201 is an inert gas such as the $TiCl_4$, the $NH_3$ and $N_2$. A gas phase reaction (thermal CVD reaction) occurs between the $TiCl_4$ and the $NH_3$ such that a titanium nitride layer having a predetermined film thickness is deposited on a surface or an underlying layer of the wafer 200. Here, in addition to the continuous layer made of titanium nitride, the titanium nitride layer includes discontinuous layers, thin films obtained by overlapping the discontinuous layers, or thin films to which other elements are added. In addition, the continuous layer made of titanium nitride is often referred to as a titanium nitride thin film.

(Step S12)

In step S12, the valve 314 of the gas supply tube 310 is closed to stop the supply of the $TiCl_4$ into the processing chamber 201, and the valve 614 is opened to flow the $TiCl_4$ through the vent line 610. As a result, the $TiCl_4$ may be stably supplied into the processing chamber. Here, a time period during which the wafer 200 is exposed to the $NH_3$ after the supply of the $TiCl_4$ is stopped ranges, for example, from 0.1 to 30 seconds.

(Step S13)

In step S13, the valve 324 of the gas supply tube 320 is closed to stop the supply of the $NH_3$ into the processing chamber 201. In this case, the valve 243 of the gas exhaust pipe 231 is opened to exhaust the inside of the processing chamber 201 using the vacuum pump 246 until the inner pressure of the processing chamber 201 reaches 20 Pa or less to discharge the remaining the $TiCl_4$ and the $NH_3$ from the processing chamber 201. In this case, when the switching valve 514 and the switching valve 524 are kept open to supply an inert gas such as $N_2$ into the processing chamber 201 from the carrier gas supply tube 510 connected on the way to the gas supply tube 310 and the carrier gas supply tube 520 connected on the way to the gas supply tube 320, the remaining the $TiCl_4$ and the $NH_3$ may be discharged more effectively. In addition, a gas such as the $TiCl_4$ and the $NH_3$ can be prevented from entering the gas supply tube 310 and the gas supply tube 320 from the processing chamber 201. Here, a time taken to remove an inner atmosphere of the processing chamber ranges, for example, from 3 to 10 seconds.

That is, after the source gas, the $TiCl_4$, and the modification gas, the $NH_3$, are supplied simultaneously, a film-forming cycle is completed with a modification process by first stopping the supply of the source gas and then stopping the supply of the modification gas (delaying a time point required to stop the supply of the modification gas). Therefore, reducing a ratio of Cl remaining in the film is possible. In addition, after the source gas and the modification gas are supplied separately or simultaneously, both or either of the source gas and the modification gas to be supplied next may effectively react with each other by stopping the supply of a gas to remove products (the source gas, the modification gas, and intermediates, and byproducts thereof) remaining in the reaction chamber.

(Step S14)

In step S14, the valve 324 of the gas supply tube 320 is opened to supply the $NH_3$ into the processing chamber.

In this case, an opening level of the valve 243 is suitably adjusted to maintain the inner pressure of the processing chamber 201 within a range of 20 to 50 Pa, for example, 30 Pa. A supply flow rate of the $NH_3$ controlled by the mass flow controller 322 ranges, for example, from 5.0 to 8.0 slm. A time taken to expose the wafer 200 to the $NH_3$ ranges, for example, from 5 to 30 seconds.

That is, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber and exposing the substrate to only the modification gas, the $NH_3$. Therefore, effective removal of Cl in the film is possible.

(Step S15)

The valve 324 of the gas supply tube 320 is closed to stop the supply of the $NH_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $NH_3$ from the processing chamber 201. In this case, when an inert gas such as $N_2$ is supplied into the processing chamber 201, the remaining the $NH_3$ may be discharged more effectively. A time taken to discharge $NH_3$ in the processing chamber 201 ranges, for example, from 3 to 10 seconds.

A TiN film having a predetermined film thickness is formed on the wafer 200 using many kinds of other CVD methods while removing a gas in the processing chamber 201 by performing steps S11 through S15 as one cycle once or a predetermined number of times. In addition, the reaction may be facilitated by applying plasma or irradiating light during the above-described sequence.

Hereinafter, only parts of this embodiment different from those of the first embodiment will now be described.

[Second Embodiment]

Figure 6:
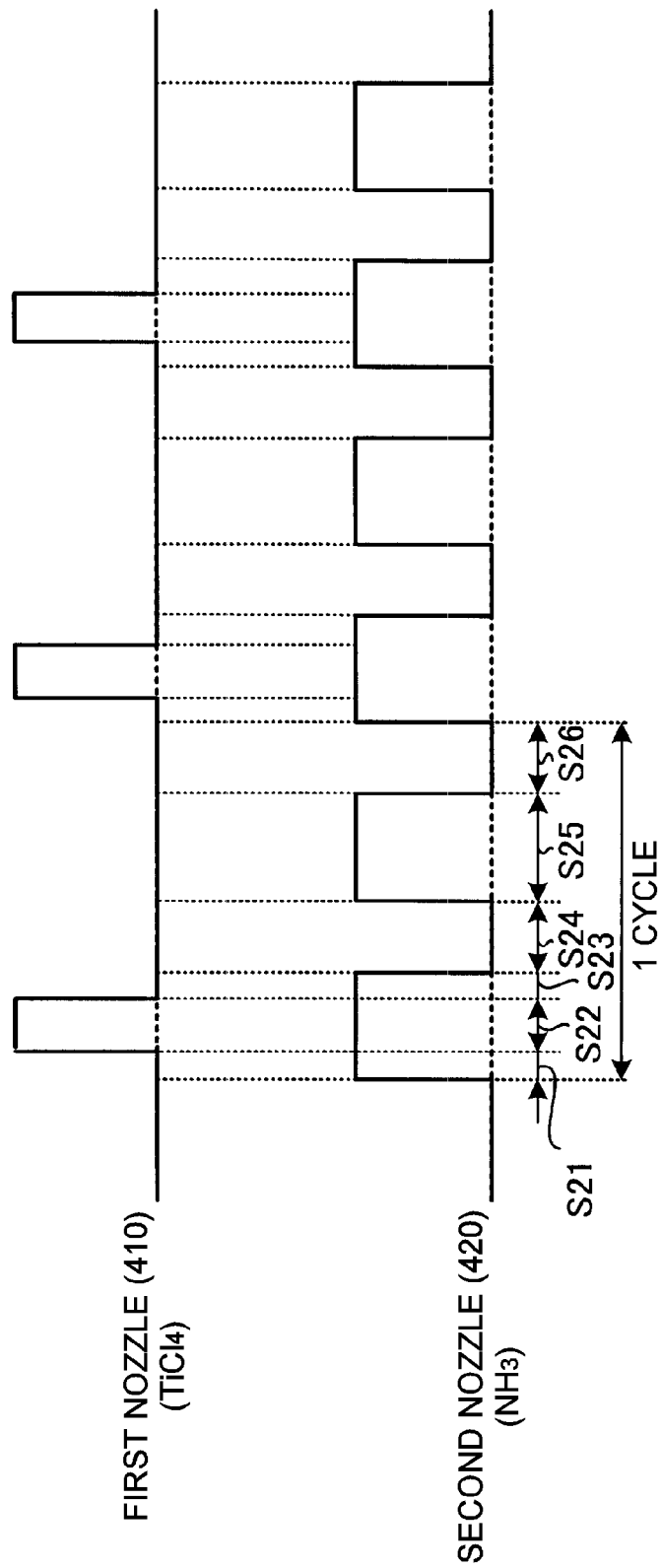
FIG. 6 is a diagram illustrating a film-forming sequence in accordance with a second embodiment of the present invention.
Figure 7:
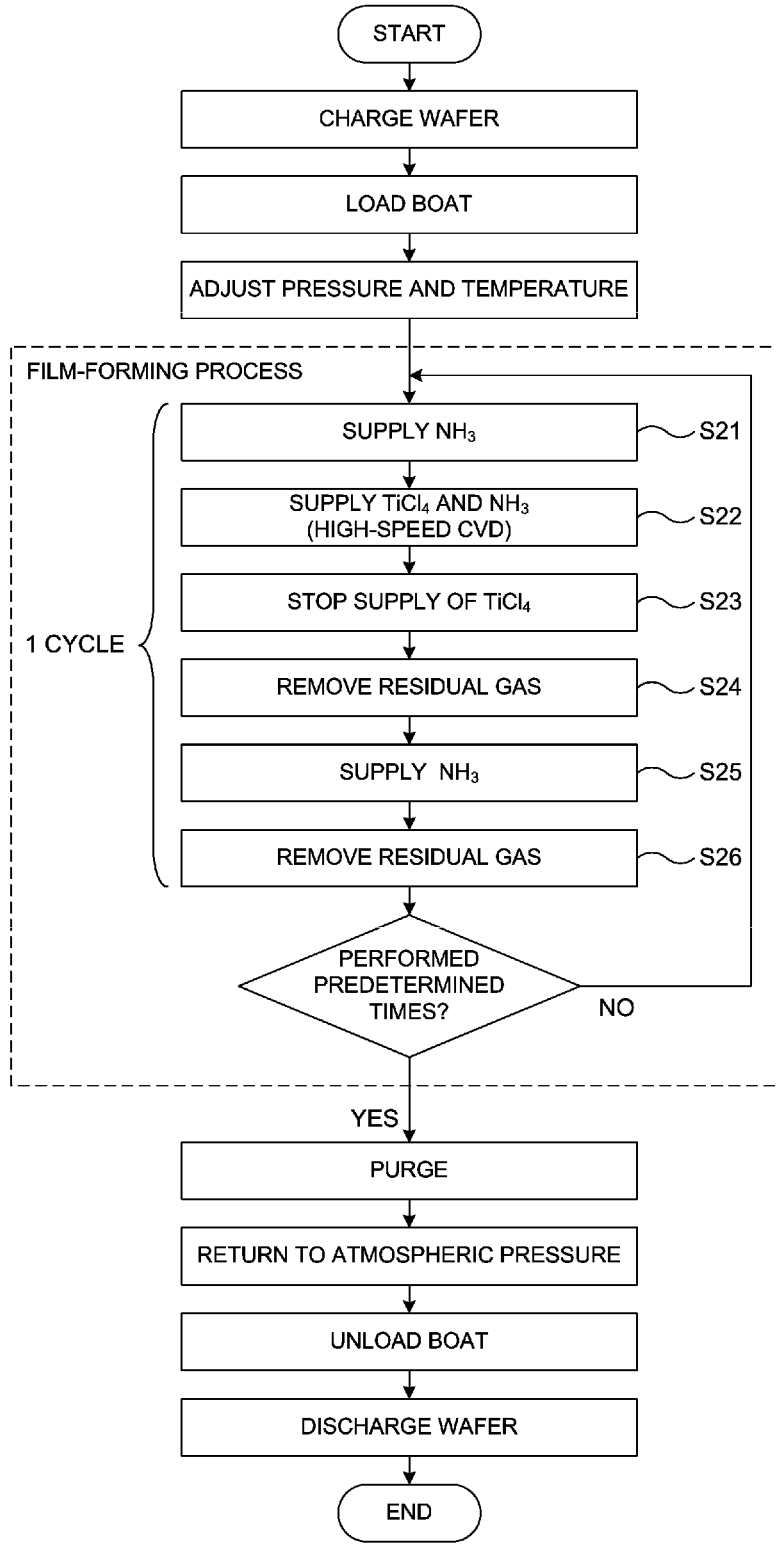
FIG. 7 is a flow diagram illustrating a process in accordance with a second embodiment of the present invention.

FIG. 6 shows a sequence according to a second embodiment. In addition, FIG. 7 is a flow diagram illustrating a process according to the second embodiment. The sequence according to the second embodiment will be described with reference to FIGS. 6 and 7.

(Step S21)

In step S21, the valve 324 of the gas supply tube 320 is opened to supply the $NH_3$ into the processing chamber 201. A time taken to expose the wafer 200 to the $NH_3$ ranges, for example, from 0.1 to 30 seconds.

(Step S22)

Next, the valve 314 of the gas supply tube 310 is opened to supply the $TiCl_4$ into the processing chamber 201. A time taken to expose the wafer 200 to the $TiCl_4$ and the $NH_3$ ranges, for example, from 5 to 30 seconds.

(Step S23)

In step S23, the valve 314 of the gas supply tube 310 is closed to stop the supply of the $TiCl_4$ into the processing chamber 201, and the valve 614 is open to allow the $TiCl_4$ to flow into the vent line 610. The supply of the $TiCl_4$ into the processing chamber 201 is stopped, and A time period during which the wafer 200 is exposed to the $NH_3$ ranges, for example, from 0.1 to 30 seconds.

(Step S24)

In step S24, the valve 324 of the gas supply tube 320 is closed to stop the supply of the $NH_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $TiCl_4$ and the $NH_3$ from the processing chamber 201. In this case, when an inert gas such as $N_2$ is supplied into the processing chamber 201, the remaining the TiCl$_4$ and the NH$_3$ may be discharged more effectively. A time taken to remove an inner atmosphere of the processing chamber ranges, for example, from 3 to 10 seconds.

(Step S25)

In step S25, the valve 324 of the gas supply tube 320 is opened to supply the NH$_3$ into the processing chamber 201. A time taken to expose the wafer 200 to the NH$_3$ ranges, for example, from 5 to 30 seconds.

(Step S26)

The valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the NH$_3$ from the processing chamber 201. In this case, when an inert gas such as N$_2$ is supplied into the processing chamber 201, the remaining the NH$_3$ may be discharged more effectively. A time taken to discharge NH$_3$ in the processing chamber 201 ranges, for example, from 3 to 10 seconds.

A TiN film having a predetermined film thickness is formed on the wafer 200 using many kinds of other CVD methods while removing a gas in the processing chamber 201 by performing steps S21 through S26 as one cycle once or a predetermined number of times.

According to the second embodiment, since a CVD reaction between the source gas and the modification gas is caused by supplying the source gas and the modification gas simultaneously, a higher film-forming rate may be achieved compared to the ALD reaction. After the source gas and the modification gas are supplied simultaneously, a film-forming cycle is completed with a modification process by first stopping the supply of the source gas and then stopping the supply of the modification gas (delaying a time point required to stop the supply of the modification gas). Therefore, reducing a ratio of Cl remaining in the film is possible. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. In addition, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber, and exposing the substrate to only the modification gas, the NH$_3$. Therefore, effective removal of Cl in the film is possible. Even when the source gas and the modification gas are also supplied simultaneously, time points for the supply of the source gas and the modification gas are slightly different at every cycle. Therefore, the film thickness may be varied at every cycle. From these facts, a supply time of the source gas may be maintained nearly at a constant level between batches by supplying the source gas, the TiCl$_4$, after the modification gas, the NH$_3$, is supplied as described in this embodiment, and stopping the supply of the source gas in a state where the modification gas is being supplied. Therefore, a film thickness of the film formed in the CVD reaction can be controlled using only a pulse of the source gas.

[Third Embodiment]

Figure 8:
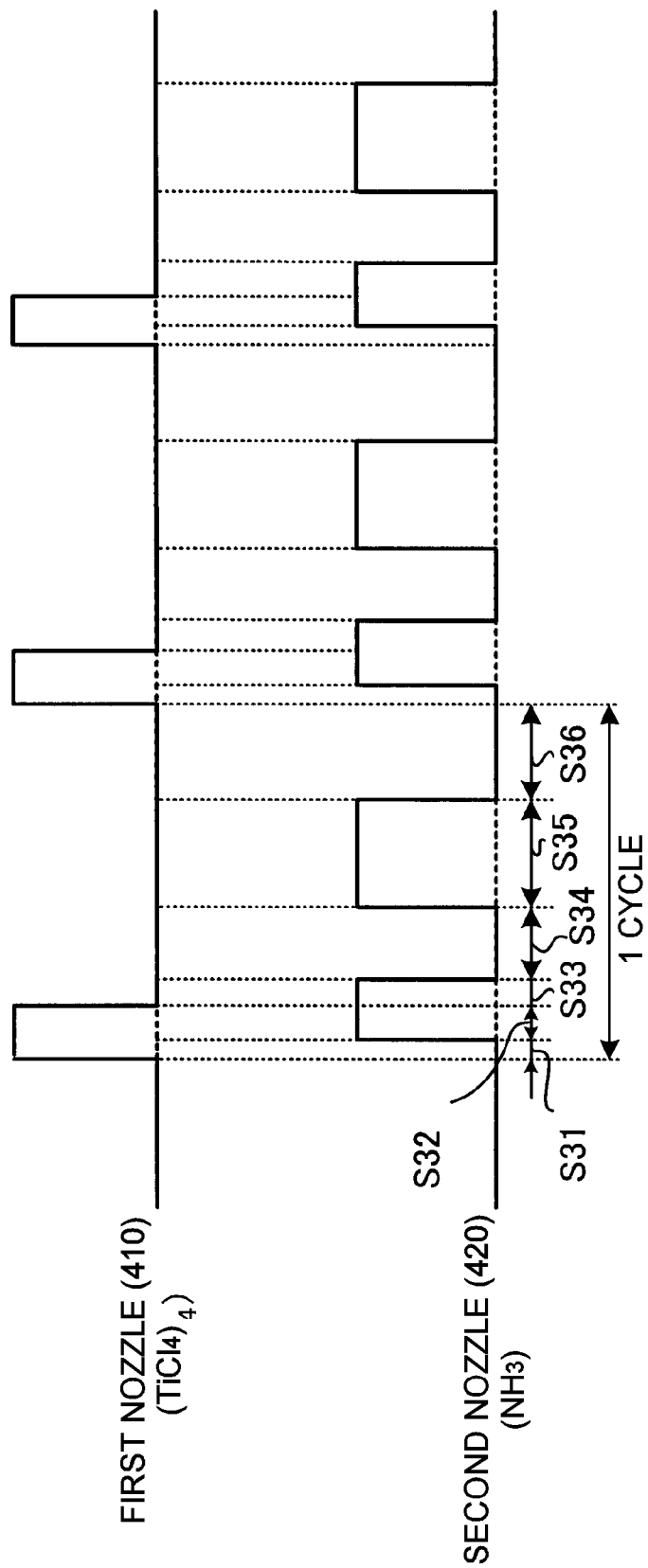
FIG. 8 is a diagram illustrating a film-forming sequence in accordance with a third embodiment of the present invention.
Figure 9:
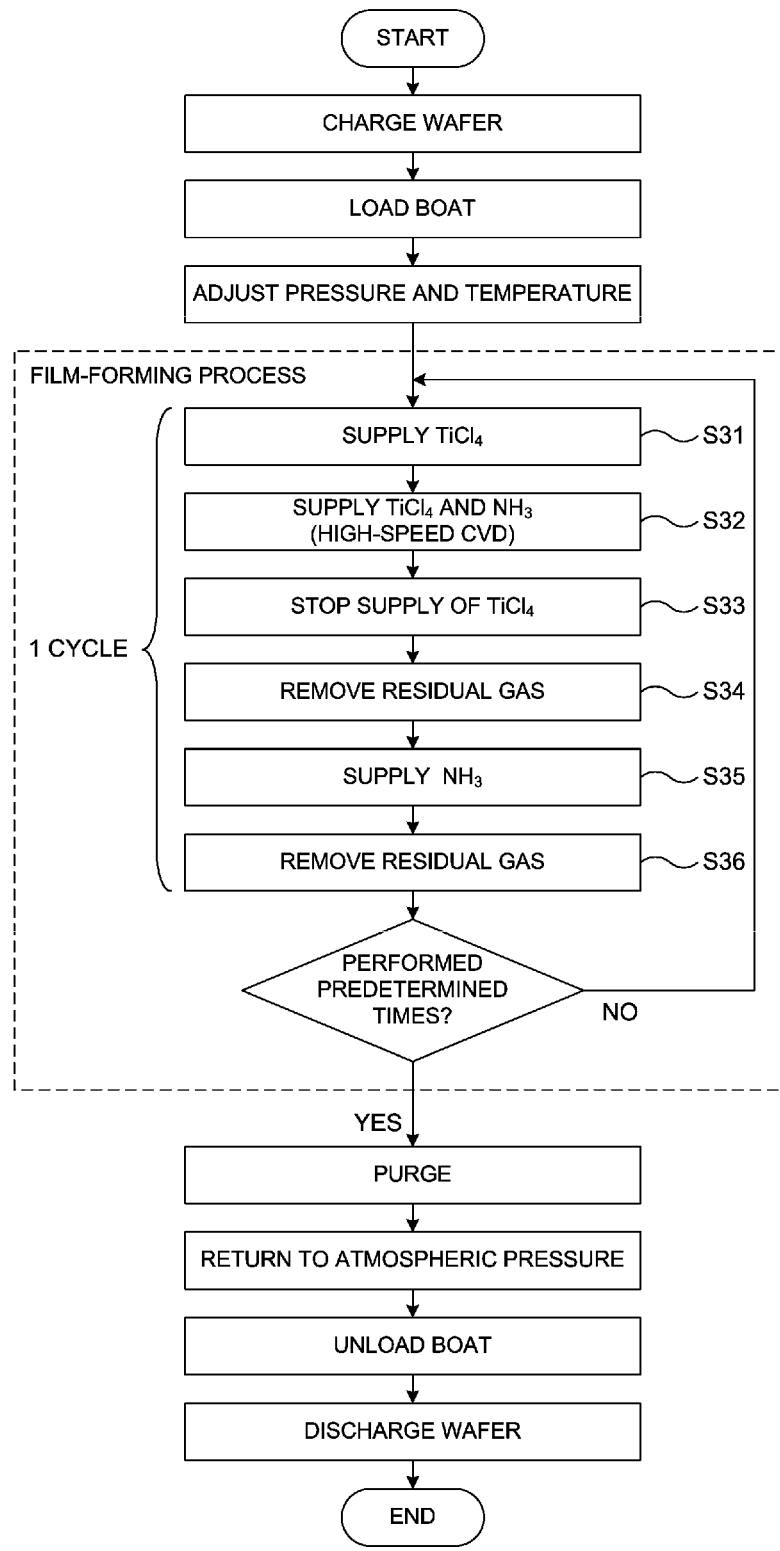
FIG. 9 is a flow diagram illustrating a process in accordance with a third embodiment of the present invention.

FIG. 8 shows a sequence according to a third embodiment. In addition, FIG. 9 is a flow diagram illustrating a process according to the third embodiment. Hereinafter the sequence according to the third embodiment will now be described with reference to FIGS. 8 and 9.

(Step S31)

In step S31, the valve 314 of the gas supply tube 310 is opened to supply the TiCl$_4$ into the processing chamber 201. A time taken to expose the wafer 200 to the TiCl$_4$ ranges, for example, from 0.1 to 30 seconds.

(Step S32)

Next, the valve 324 of the gas supply tube 320 is opened to supply the NH$_3$ into the processing chamber 201. Here, A time period during which the wafer 200 is exposed to the TiCl$_4$ and the NH$_3$ ranges, for example, from 5 to 30 seconds.

(Step S33)

In step S33, the valve 314 of the gas supply tube 310 is closed to stop the supply of the TiCl$_4$ into the processing chamber 201, and the valve 614 is open to allow the TiCl$_4$ to flow into the vent line 610. The supply of the TiCl$_4$ is stopped, and A time period during which the wafer 200 is exposed to the NH$_3$ ranges, for example, from 0.1 to 30 seconds.

(Step S34)

In step S34, the valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the TiCl$_4$ and the NH$_3$ from the processing chamber 201. In this case, when an inert gas such as N$_2$ is supplied into the processing chamber 201, the remaining the TiCl$_4$ and the NH$_3$ may be discharged more effectively. A time taken to remove an inner atmosphere of the processing chamber 201 ranges, for example, from 3 to 10 seconds.

(Step S35)

In step S35, the valve 324 of the gas supply tube 320 is opened to supply the NH$_3$ into the processing chamber 201. A time taken to expose the wafer 200 to the NH$_3$ ranges, for example, from 5 to 30 seconds.

(Step S36)

The valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the NH$_3$ from the processing chamber 201. In this case, when an inert gas such as N$_2$ is supplied into the processing chamber 201, the remaining the NH$_3$ may be discharged more effectively. A time taken to discharge NH$_3$ in the processing chamber 201 ranges, for example, from 3 to 10 seconds.

A TiN film having a predetermined film thickness is formed on the wafer 200 using many kinds of other CVD methods while removing a gas in the processing chamber 201 by performing steps S31 through S36 as one cycle once or a predetermined number of times.

According to the third embodiment, since a CVD reaction between the source gas and the modification gas is caused by supplying the source gas and the modification gas simultaneously, a higher film-forming rate may be achieved compared to the ALD reaction. After the source gas and the modification gas are supplied simultaneously, a film-forming cycle is completed with a modification process by first stopping the supply of the source gas and then stopping the supply of the modification gas (delaying a time point required to stop the supply of the modification gas). Therefore, reducing a ratio of Cl remaining in the film is possible. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. In addition, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber, and exposing the substrate to only the modification gas, the $NH_3$. Therefore, effective removal of Cl in the film is possible. Before the CVD reaction between the source gas, the $TiCl_4$, and the modification gas, the $NH_3$, seed crystals having a low Cl concentration may also be formed on the substrate by exposing the substrate to only the source gas, the $TiCl_4$, to adsorb the source gas and intermediates thereof onto the substrate during the ALD reaction.

[Fourth Embodiment]

Figure 10:
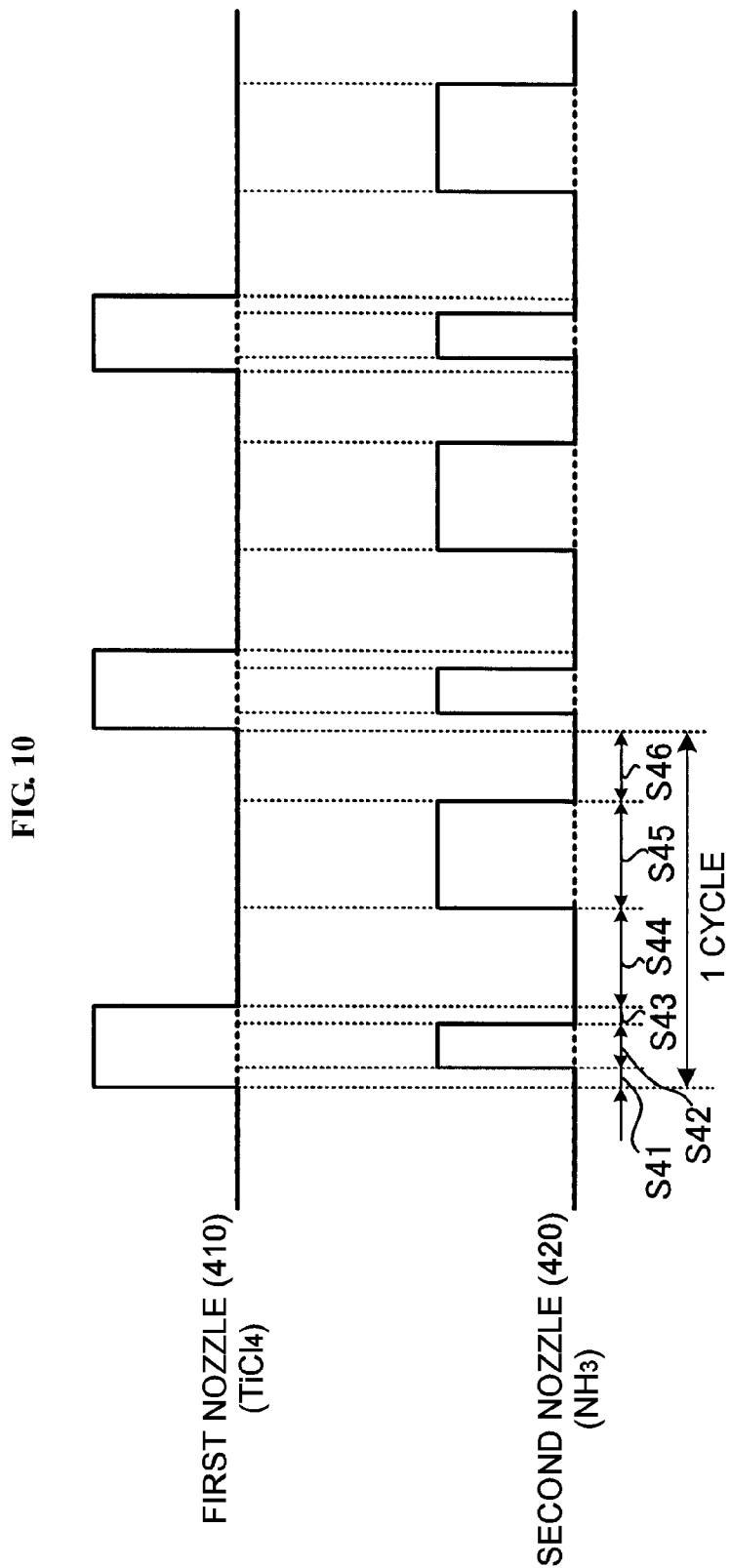
FIG. 10 is a diagram illustrating a film-forming sequence in accordance with a fourth embodiment of the present invention.
Figure 11:
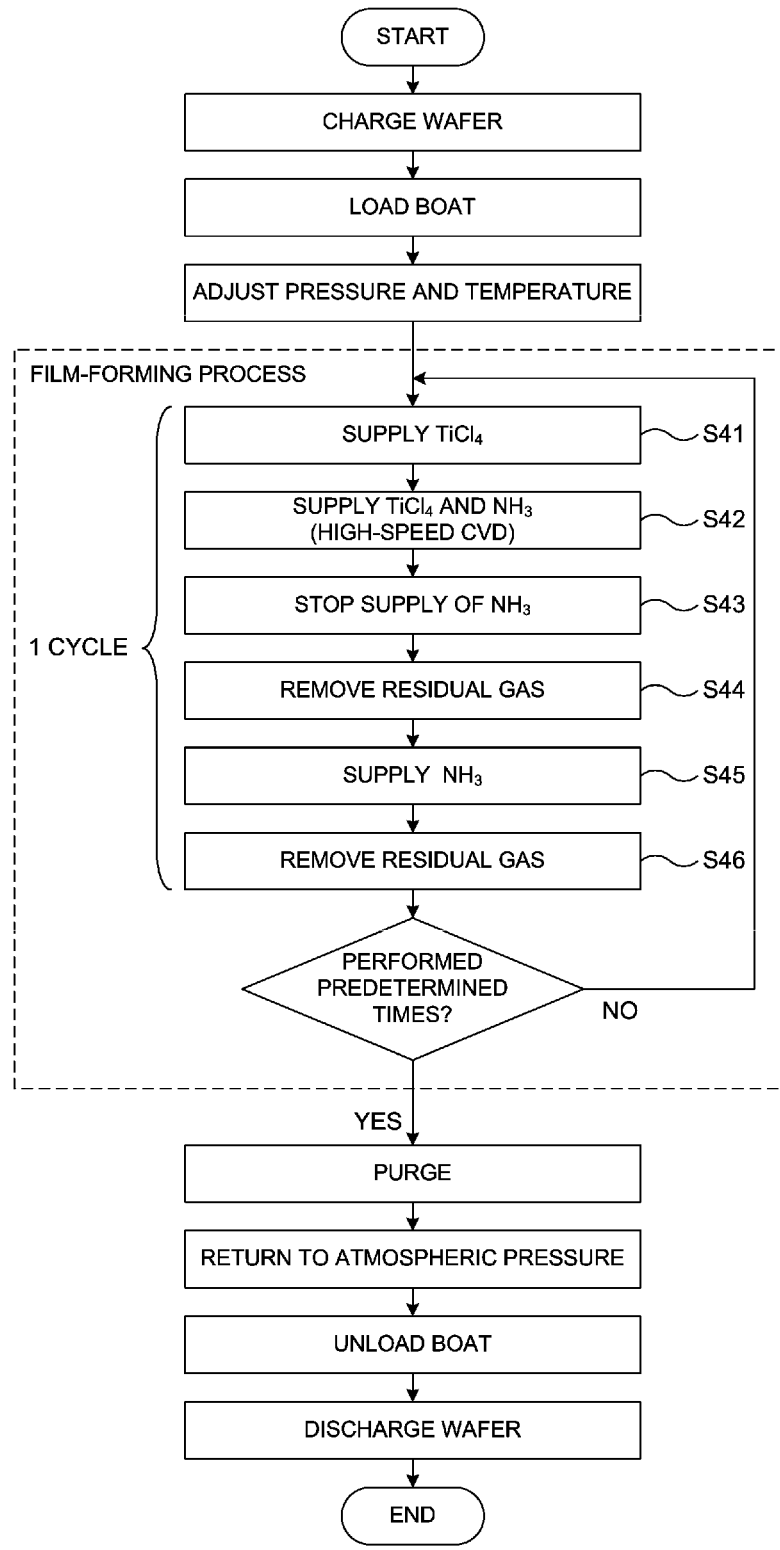
FIG. 11 is a flow diagram illustrating a process in accordance with a fourth embodiment of the present invention.

FIG. 10 shows a sequence according to a fourth embodiment. In addition, FIG. 11 is a flow diagram illustrating a process according to the fourth embodiment. Hereinafter the sequence according to the fourth embodiment will now be described with reference to FIGS. 10 and 11.

(Step S41)

In step S41, the valve 314 of the gas supply tube 310 is opened to supply the $TiCl_4$ into the processing chamber 201. A time taken to expose the wafer 200 to the $TiCl_4$ ranges, for example, from 0.1 to 30 seconds.

(Step S42)

Next, the valve 324 of the gas supply tube 320 is opened to supply the $NH_3$ into the processing chamber 201. Here, A time period during which the wafer 200 is exposed to the $TiCl_4$ and the $NH_3$ ranges, for example, from 5 to 30 seconds.

(Step S43)

In step S43, the valve 324 of the gas supply tube 320 is closed to stop the supply of the $NH_3$ into the processing chamber 201. The supply of the $NH_3$ is stopped, and A time period during which the wafer 200 is exposed to the $TiCl_4$ ranges, for example, from 0.1 to 30 seconds.

(Step S44)

In step S44, the valve 314 of the gas supply tube 310 is closed to stop the supply of the $TiCl_4$ into the processing chamber 201, and the valve 614 is opened to allow the $TiCl_4$ to flow into the vent line 610. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $TiCl_4$ and the $NH_3$ from the processing chamber 201. In this case, when an inert gas such as $N_2$ is supplied into the processing chamber 201, the remaining the $TiCl_4$ and the $NH_3$ may be discharged more effectively. A time taken to remove an inner atmosphere of the processing chamber 201 ranges, for example, from 3 to 10 seconds.

(Step S45)

In step S45, the valve 324 of the gas supply tube 320 is opened to supply the $NH_3$ into the processing chamber 201. A time taken to expose the wafer 200 to the $NH_3$ ranges, for example, from 5 to 30 seconds.

(Step S46)

The valve 324 of the gas supply tube 320 is closed to stop the supply of the $NH_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $NH_3$ from the processing chamber 201. In this case, when an inert gas such as $N_2$ is supplied into the processing chamber 201, the remaining the $NH_3$ may be discharged more effectively. A time taken to discharge $NH_3$ in the processing chamber 201 ranges, for example, from 3 to 10 seconds.

A TiN film having a predetermined film thickness is formed on the wafer 200 using many kinds of other CVD methods while removing a gas in the processing chamber 201 by performing steps S41 through S46 as one cycle once or a predetermined number of times.

According to the fourth embodiment, since a CVD reaction between the source gas and the modification gas is caused by supplying the source gas and the modification gas simultaneously, a higher film-forming rate may be achieved compared to the ALD reaction. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. In addition, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber, and exposing the substrate to only the modification gas, the $NH_3$. Therefore, effective removal of Cl in the film is possible. Before the CVD reaction between the source gas, the $TiCl_4$, and the modification gas, the $NH_3$, seed crystals having a low Cl concentration may also be formed on the substrate by exposing the substrate to only the source gas, the $TiCl_4$, to adsorb the source gas and intermediates thereof onto the substrate during the ALD reaction. Even when the source gas and the modification gas are also supplied simultaneously, time points for the supply of the source gas and the modification gas are slightly different at every cycle. Therefore, the film thickness may be varied at every cycle. From these facts, unlike the above-described second embodiment, a supply time of the modification gas may be maintained nearly at a constant level between batches by supplying the modification gas, the $NH_3$, after the source gas, the $TiCl_4$, is supplied in this embodiment, and stopping the supply of the modification gas in a state where the source gas is being supplied. Therefore, a film thickness of the film formed in the CVD reaction can be controlled using only a pulse of the modification gas.

Next, a case where a film is formed by a CVD method through a process in which there is a time zone at which pulses of the Ti source and the N source are in an ON state simultaneously and only one of the pulses of the Ti source and the N source is in an ON state in one cycle of the film-forming sequence will be described.

[Fifth Embodiment]

Figure 12:
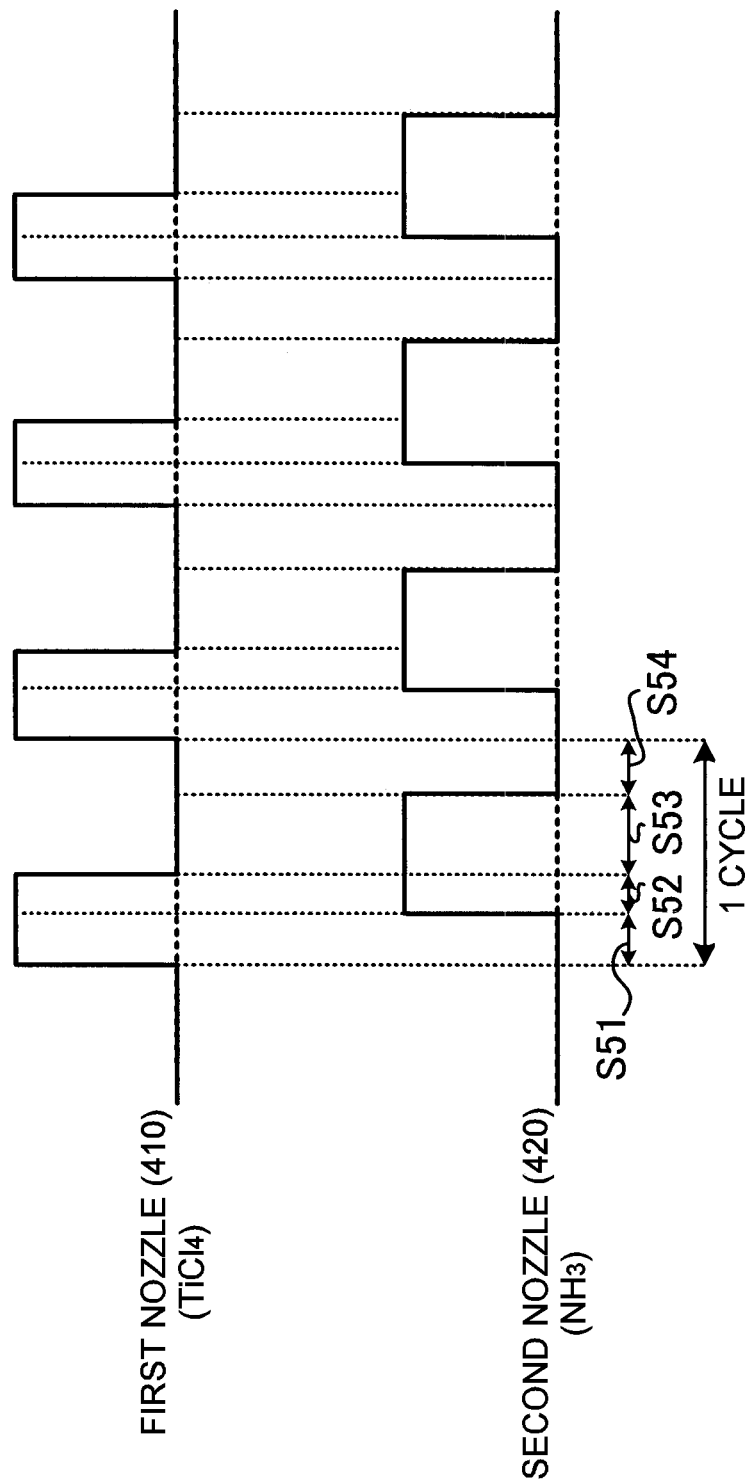
FIG. 12 is a diagram illustrating a film-forming sequence in accordance with a fifth embodiment of the present invention.
Figure 13:
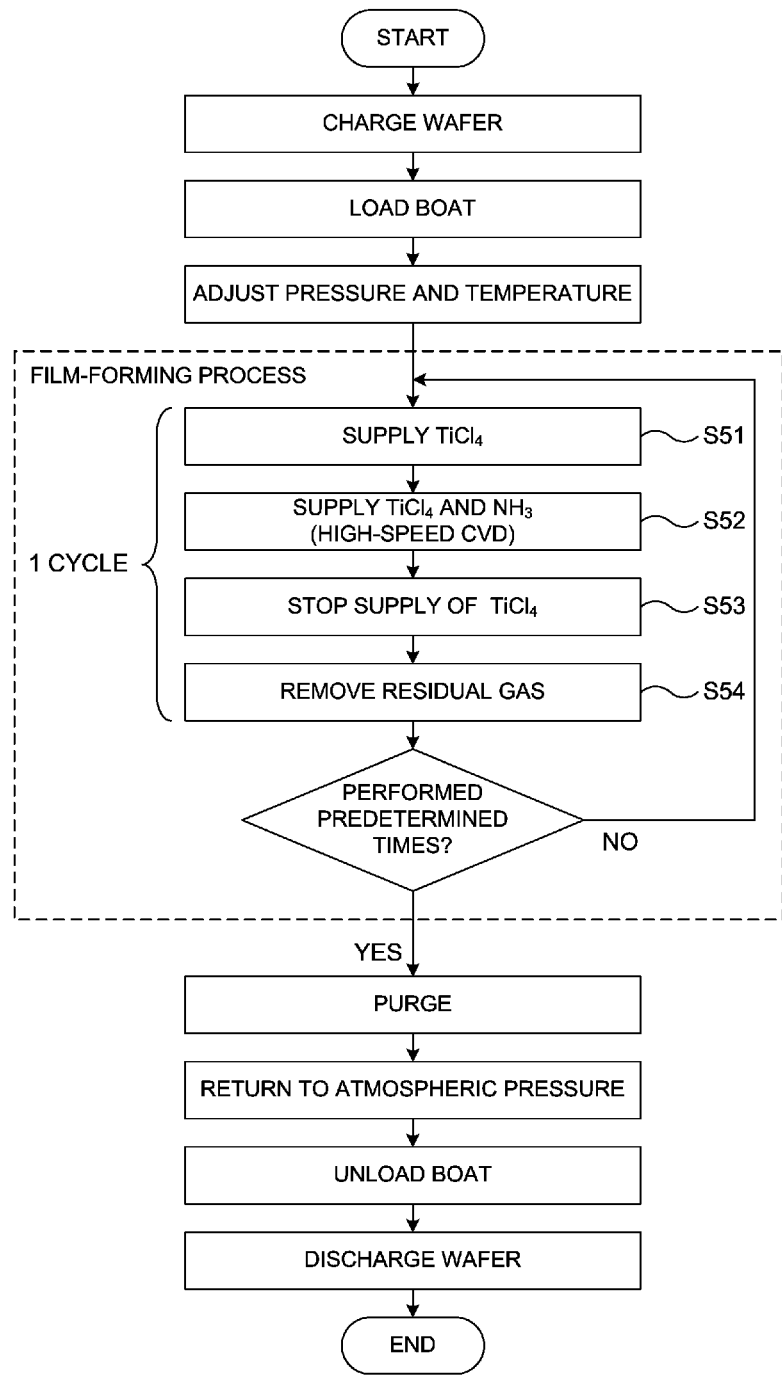
FIG. 13 is a flow diagram illustrating a process in accordance with a fifth embodiment of the present invention.

FIG. 12 shows a sequence according to a fifth embodiment. In addition, FIG. 13 is a flow diagram illustrating a process according to the fifth embodiment. Hereinafter the sequence according to the fifth embodiment will now be described with reference to FIGS. 12 and 13.

(Step S51)

In step S51, the valve 314 of the gas supply tube 310 is opened to start the supply of the $TiCl_4$. A time taken to expose the wafer 200 to the $TiCl_4$ ranges, for example, from 0.1 to 30 seconds.

(Step S52)

In step S52, the valve 324 of the gas supply tube 320 is opened to supply the $NH_3$ into the processing chamber 201. Here, A time period during which the wafer 200 is exposed to the $TiCl_4$ and the $NH_3$ ranges, for example, from 5 to 30 seconds.

(Step S53)

In step S53, the valve 314 of the gas supply tube 310 is closed to stop the supply of the $TiCl_4$ into the processing chamber 201, and the valve 614 is opened to allow the $TiCl_4$ to flow into the vent line 610. The supply of the $TiCl_4$ is stopped, and A time period during which the wafer 200 is exposed to the $NH_3$ ranges, for example, from 5 to 30 seconds.

(Step S54)

In step S54, the valve 324 of the gas supply tube 320 is closed to stop the supply of the $NH_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $TiCl_4$ and the $NH_3$ from the processing chamber 201. In this case, when an inert gas such as $N_2$ is supplied into the processing chamber 201, the remaining the $TiCl_4$ and the $NH_3$ may be discharged more effectively. A time taken to remove an inner atmosphere of the processing chamber ranges, for example, from 3 to 10 seconds.

A TiN film having a predetermined film thickness is formed on the wafer 200 using many kinds of other CVD methods while removing a gas in the processing chamber 201 by performing steps S51 through S54 as one cycle once or a predetermined number of times.

According to the fifth embodiment, since a CVD reaction between the source gas and the modification gas is caused by supplying the source gas and the modification gas simultaneously, a higher film-forming rate may be achieved, than the ALD reaction. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. Before the CVD reaction between the source gas, the $TiCl_4$, and the modification gas, the $NH_3$, seed crystals having a low Cl concentration may also be formed on the substrate by exposing the substrate to only the source gas, the $TiCl_4$, to adsorb the source gas and intermediates thereof onto the substrate during the ALD reaction.

[Sixth Embodiment]

Figure 14:
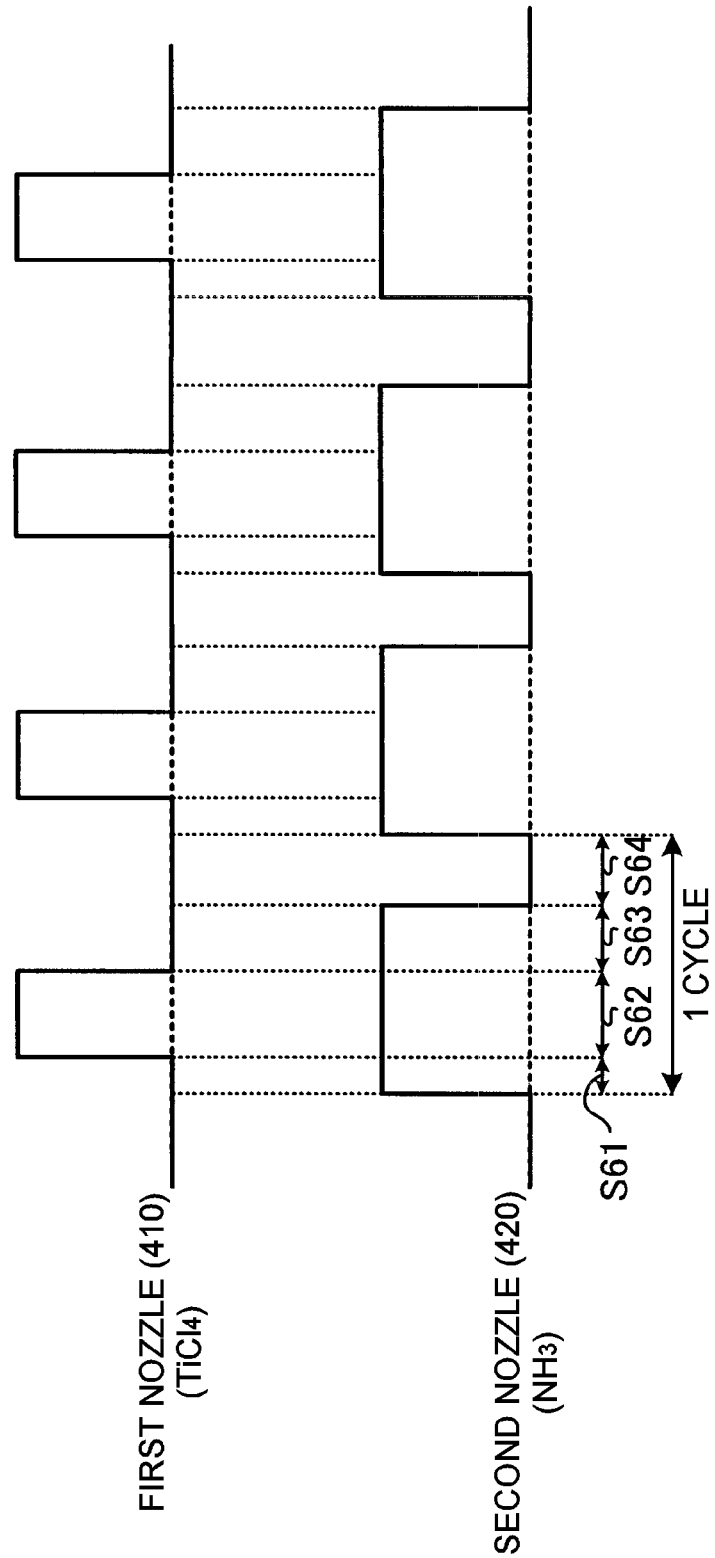
FIG. 14 is a diagram illustrating a film-forming sequence in accordance with a sixth embodiment of the present invention.
Figure 15:
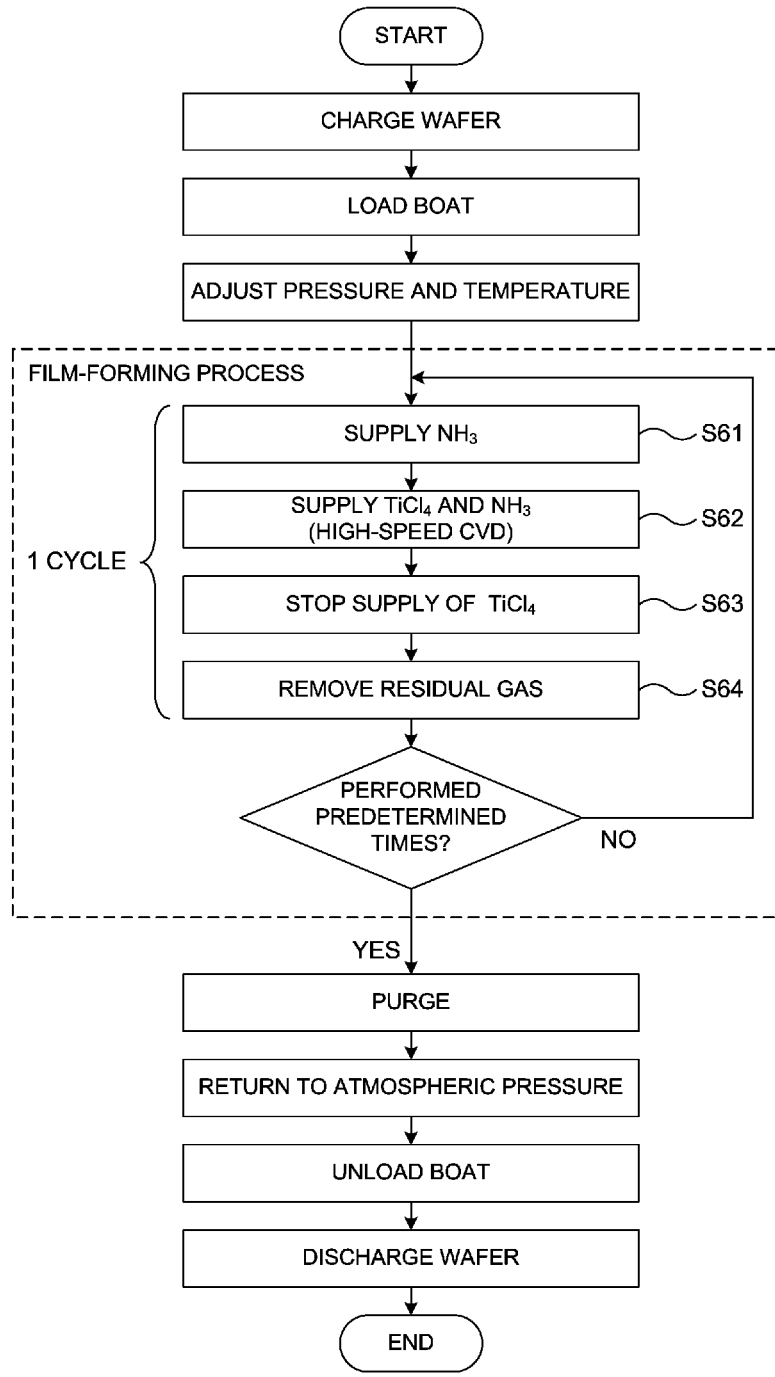
FIG. 15 is a flow diagram illustrating a process in accordance with a sixth embodiment of the present invention.

FIG. 14 shows a sequence according to a sixth embodiment. In addition, FIG. 15 is a flow diagram illustrating a process according to the sixth embodiment. Hereinafter the sequence according to the sixth embodiment will now be described with reference to FIGS. 14 and 15.

(Step S61)

In step S61, the valve 324 of the gas supply tube 320 is opened to supply the $NH_3$ into the processing chamber 201. A time taken to expose the wafer 200 to the $NH_3$ ranges, for example, from 0.1 to 30 seconds.

(Step S62)

In step S62, the valve 314 of the gas supply tube 310 is opened to start the supply of the $TiCl_4$. A time taken to expose the wafer 200 to the $TiCl_4$ and the $NH_3$ ranges, for example, from 5 to 30 seconds.

(Step S63)

In step S63, the valve 314 of the gas supply tube 310 is closed to stop the supply of the $TiCl_4$ into the processing chamber 201, and the valve 614 is opened to allow the $TiCl_4$ to flow into the vent line 610. The supply of the $TiCl_4$ is stopped, and A time period during which the wafer 200 is exposed to the $NH_3$ ranges, for example, from 0.1 to 30 seconds.

(Step S64)

In step S64, the valve 324 of the gas supply tube 320 is closed to stop the supply of the $NH_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the $TiCl_4$ and the $NH_3$ from the processing chamber 201. In this case, when an inert gas such as $N_2$ is supplied into the processing chamber 201, the remaining the $TiCl_4$ and the $NH_3$ may be discharged more effectively. A time taken to remove an inner atmosphere of the processing chamber ranges, for example, from 3 to 10 seconds.

A TiN film having a predetermined film thickness is formed on the wafer 200 using many kinds of other CVD methods while removing a gas in the processing chamber 201 by performing steps S61 through S64 as one cycle once or a predetermined number of times.

According to the sixth embodiment, since a CVD reaction between the source gas and the modification gas is caused by supplying the source gas and the modification gas simultaneously, a higher film-forming rate may be achieved compared to the ALD reaction. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. In addition, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber, and exposing the substrate to only the modification gas, the $NH_3$. Therefore, effective removal of Cl in the film is possible. In addition, a supply time of the source gas may be maintained nearly at a constant level between batches by supplying the source gas, the $TiCl_4$, after the modification gas, the $NH_3$, is supplied, and stopping the supply of the source gas in a state where the modification gas is being supplied. Therefore, a film thickness of the film formed in the CVD reaction can be controlled using only a pulse of the source gas.

That is, according to the fifth and sixth embodiments, in addition to the above-mentioned effects, an equivalent-quality film may be formed with higher productivity or a high-quality film may be formed with equivalent productivity compared to when one sheet of substrate to be processed is processed alone or about two sheets of substrates, that is, a small number of substrates are processed simultaneously.

Next, a case where a film is formed by a CVD method through a process in which one cycle of the film-forming sequence is composed of two or more pulses of the Ti source and two or more pulses of the N source will be described.

[Seventh Embodiment]

Figure 16:
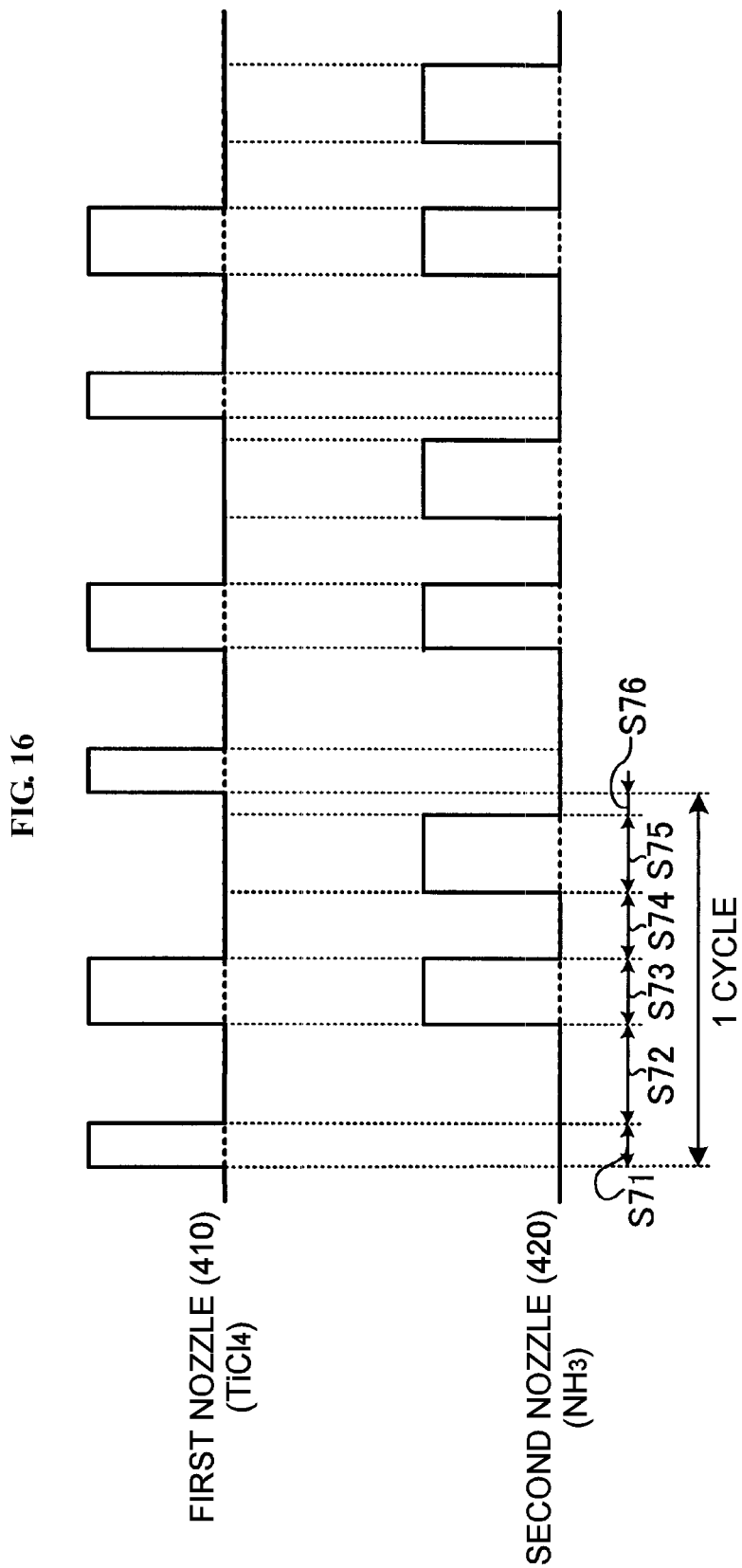
FIG. 16 is a diagram illustrating a film-forming sequence in accordance with a seventh embodiment of the present invention.
Figure 17:
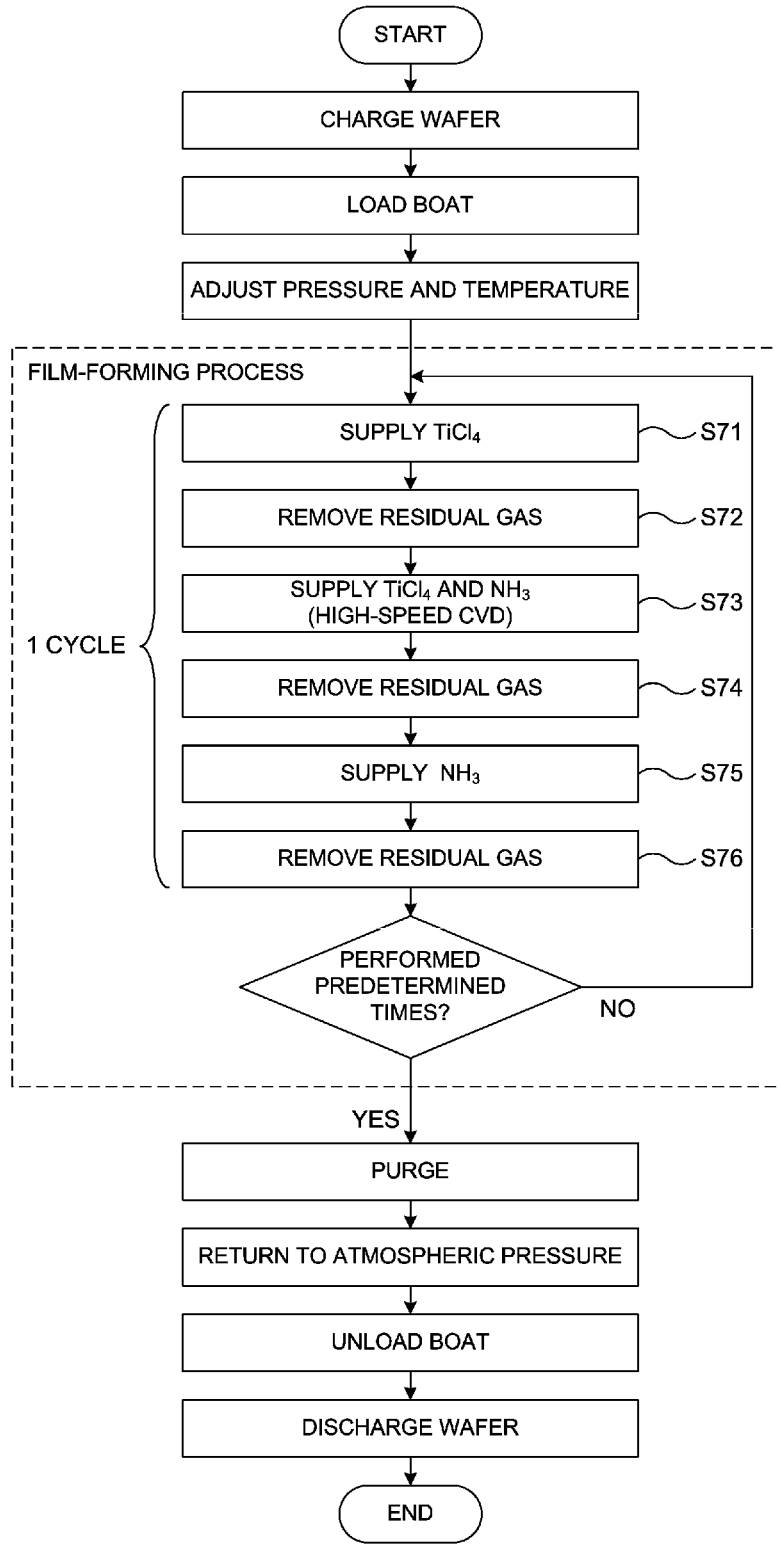
FIG. 17 is a flow diagram illustrating a process in accordance with a seventh embodiment of the present invention.

FIG. 16 shows a sequence according to a seventh embodiment. In addition, FIG. 17 is a flow diagram illustrating a process according to the seventh embodiment. Hereinafter the sequence according to the seventh embodiment will now be described with reference to FIGS. 16 and 17.

(Step S71)

In step S71, the valve 314 of the gas supply tube 310 is opened to start the supply of the TiCl$_4$.

(Step S72)

In step S72, the valve 314 of the gas supply tube 310 is closed to stop the supply of the TiCl$_4$ into the processing chamber 201, and the valve 614 is opened to allow the TiCl$_4$ to flow into the vent line 610. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the TiCl$_4$ from the processing chamber 201. In this case, when an inert gas such as N$_2$ is supplied into the processing chamber 201, the remaining the TiCl$_4$ may be discharged more effectively.

(Step S73)

In step S73, the valve 314 of the gas supply tube 310 is opened to start the supply of the TiCl$_4$, and the valve 324 of the gas supply tube 320 is simultaneously opened to supply the NH$_3$ into the processing chamber 201.

(Step S74)

In step S74, the valve 314 of the gas supply tube 310 is closed to stop the supply of the TiCl$_4$ into the processing chamber, and the valve 614 is opened to allow the TiCl$_4$ to flow into the vent line 610 and the valve 324 of the gas supply tube 320 is simultaneously closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the TiCl$_4$ and the NH$_3$ from the processing chamber 201. In this case, when an inert gas such as N$_2$ is supplied into the processing chamber 201, the remaining the TiCl$_4$ and the NH$_3$ may be discharged more effectively.

(Step S75)

In step S75, the valve 324 of the gas supply tube 320 is opened to supply the NH$_3$ into the processing chamber 201.

(Step S76)

The valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the NH$_3$ from the processing chamber 201. In this case, when an inert gas such as N$_2$ is supplied into the processing chamber 201, the remaining the NH$_3$ may be discharged more effectively.

A TiN film having a predetermined film thickness is formed on the wafer 200 using many kinds of other CVD methods while removing a gas in the processing chamber 201 by performing steps S71 through S76 as one cycle once or a predetermined number of times.

[Eighth Embodiment]

Figure 18:
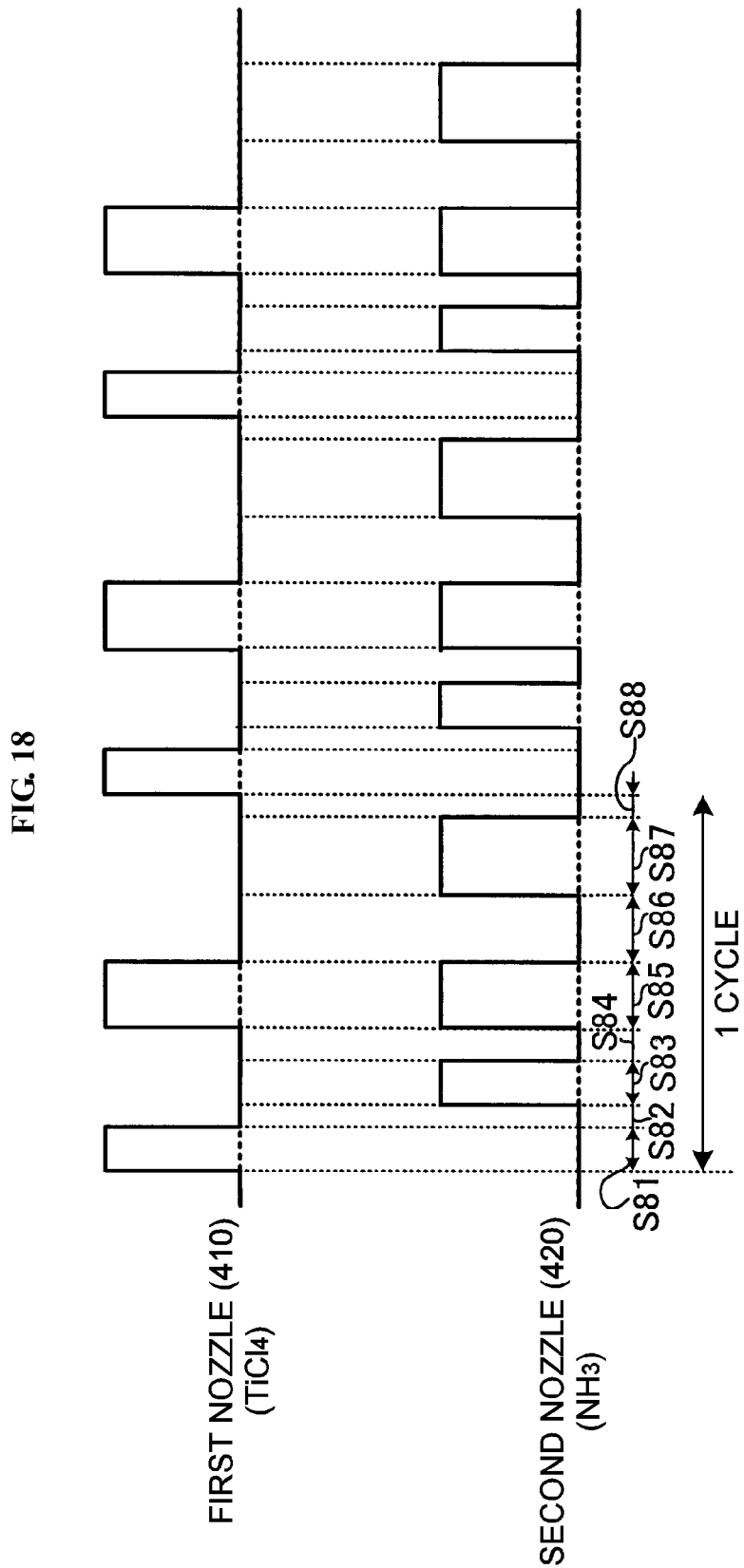
FIG. 18 is a diagram illustrating a film-forming sequence in accordance with an eighth embodiment of the present invention.
Figure 19:
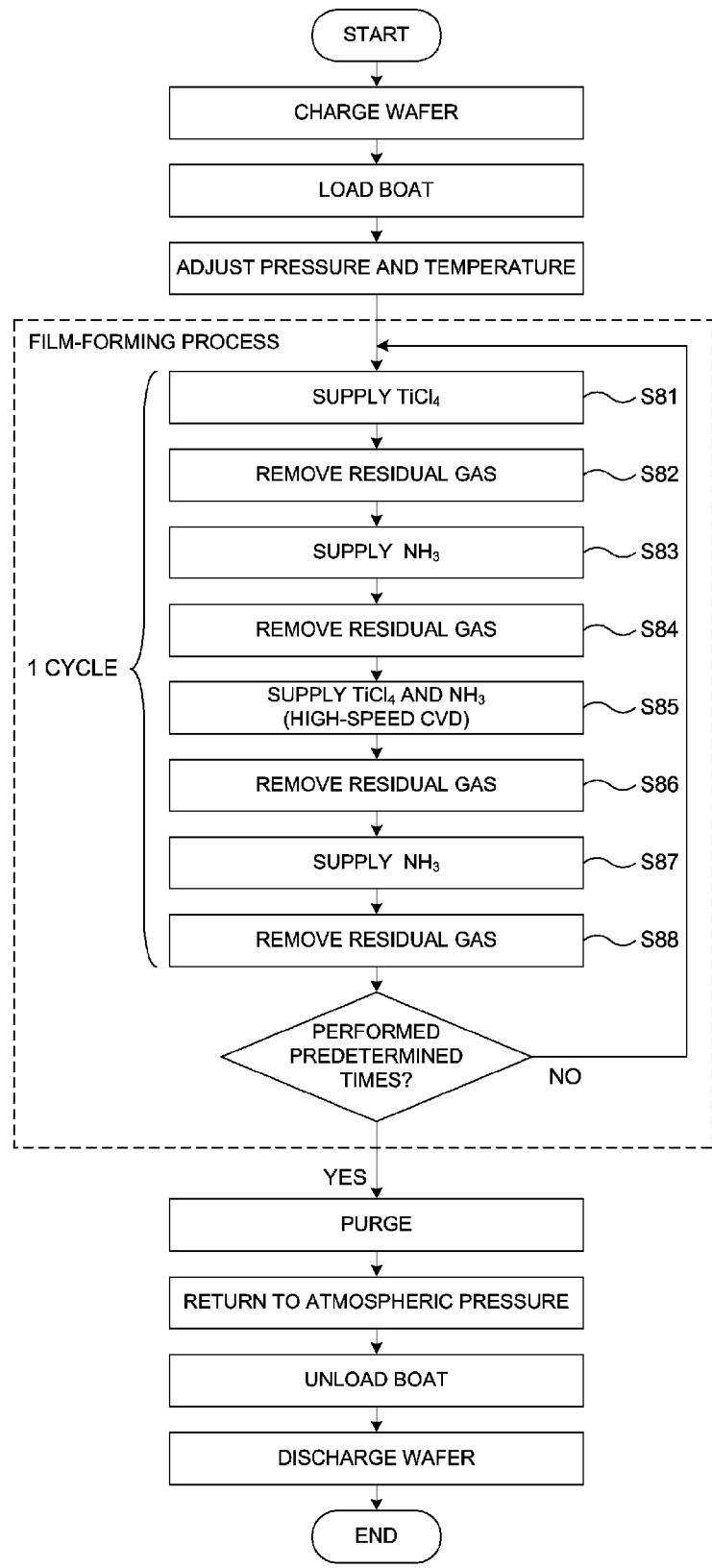
FIG. 19 is a flow diagram illustrating a process in accordance with a eighth embodiment of the present invention.

FIG. 18 shows a sequence according to an eighth embodiment. In addition, FIG. 19 is a flow diagram illustrating a process according to the eighth embodiment. Hereinafter the sequence according to the eighth embodiment will now be described with reference to FIGS. 18 and 19.

(Step S81)

In step S81, the valve 314 of the gas supply tube 310 is opened to start the supply of the TiCl$_4$.

(Step S82)

In step S82, the valve 314 of the gas supply tube 310 is closed to stop the supply of the TiCl$_4$ into the processing chamber 201, and the valve 614 is opened to allow the TiCl$_4$ to flow into the vent line 610. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the TiCl$_4$ from the processing chamber 201. In this case, when an inert gas such as N$_2$ is supplied into the processing chamber 201, the remaining the TiCl$_4$ may be discharged more effectively.

(Step S83)

In step S83, the valve 324 of the gas supply tube 320 is opened to supply the NH$_3$ into the processing chamber.

(Step S84)

The valve 324 of the gas supply tube 320 is closed to stop the supply of the NH$_3$ into the processing chamber, and the valve 614 is opened to allow the TiCl$_4$ to flow into the vent line 610. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the NH$_3$ from the processing chamber 201. In this case, when an inert gas such as N$_2$ is supplied into the processing chamber 201, the remaining the NH$_3$ may be discharged more effectively.

(Step S85)

In step S85, the valve 314 of the gas supply tube 310 is opened to start the supply of the TiCl$_4$, and the valve 324 of the gas supply tube 320 is opened to supply the NH$_3$ into the processing chamber 201.

(Step S86)

In step S86, the valve 314 of the gas supply tube 310 is closed to stop the supply of the TiCl$_4$ into the processing chamber 201, and the valve 614 is opened to allow the TiCl$_4$ to flow into the vent line 610. Simultaneously, the valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the TiCl$_4$ and the NH$_3$ from the processing chamber 201. In this case, when an inert gas such as N$_2$ is supplied into the processing chamber 201, the remaining the TiCl$_4$ and the NH$_3$ may be discharged more effectively.

(Step S87)

In step S87, the valve 324 of the gas supply tube 320 is opened to supply the NH$_3$ into the processing chamber 201.

(Step S88)

The valve 324 of the gas supply tube 320 is closed to stop the supply of the NH$_3$ into the processing chamber 201. In this case, the valve 243 of the gas exhaust pipe 231 is kept open to exhaust the inside of the processing chamber 201 using the vacuum pump 246 until the inner pressure of the processing chamber 201 reaches 20 Pa or less, and discharge the remaining the NH$_3$ from the processing chamber 201. In this case, when an inert gas such as N$_2$ is supplied into the processing chamber 201, the remaining the NH$_3$ may be discharged more effectively.

A TiN film having a predetermined film thickness is formed on the wafer 200 using many kinds of other CVD methods while removing a gas in the processing chamber 201 by performing steps S81 through S88 as one cycle once or a predetermined number of times.

In the above-described seventh and eighth embodiments, at least one pulse of each of two or more pulses of the Ti source and the N source flows simultaneously.

According to the seventh and eighth embodiments, since a CVD reaction between the source gas and the modification gas is caused by supplying the source gas and the modification gas simultaneously, a higher film-forming rate may be achieved, compare to the ALD reaction. In addition, after the source gas and the modification gas are supplied separately or simultaneously, both or either of the source gas and the modification gas to be supplied next may effectively react with each other by stopping the supply of a gas to remove products (the source gas, the modification gas, and intermediates and byproducts thereof) remaining in the reaction chamber. In addition, after the source gas and the modification gas are supplied simultaneously, an ALD reaction between the modification gas and the source gas deposited onto the substrate may be caused to facilitate generation of byproducts (HCl, etc.) by stopping the supply of both the source gas and the modification gas, removing products (the source gas, the modification gas, and intermediates and byproducts thereof) remaining in the reaction chamber and exposing the substrate to only the modification gas, the $NH_3$. Therefore, effective removal of Cl in the film is possible. Before the CVD reaction between the source gas, the $TiCl_4$, and the modification gas, the $NH_3$, seed crystals having a low Cl concentration may also be formed on the substrate by exposing the substrate to only the source gas, the $TiCl_4$, to adsorb the source gas and intermediates thereof onto the substrate during the ALD reaction. In addition, when the supply of the source gas, the $TiCl_4$, and the supply of the modification gas, the $NH_3$, are performed during two or more pulses in the one cycle, the source gas and the modification gas are supplied simultaneously during at least one pulse, and the source gas and the modification gas are separately supplied during at least one pulse. Therefore, effects such as improvement of the film-forming rate caused by the CVD reaction (an effect obtained by supplying the source gas and the modification gas simultaneously), formation of the seed crystals having a low Cl concentration caused by the ALD reaction (an effect obtained by supplying only the source gas) and removal of Cl remaining in the film caused by the ALD reaction (an effect obtained by supplying only the modification gas) may be obtained.

According to the present invention, a TiN film that is higher in quality than a TiN film formed only by the CVD method may be provided at a higher film-forming rate, that is, with a higher productivity than a TiN film formed only by the ALD method. In addition, since a high-quality thin film may be formed at a low temperature, a thermal budget may be increased.

Meanwhile, process conditions such as a temperature are not intentionally changed during the processing. However, a pressure may be suitably changed.

In addition, among the above-mentioned embodiments, the $TiCl_4$ may be first supplied to adsorb a source such as Ti onto the substrate, and the $TiCl_4$ and the $NH_3$ may then be supplied to react with the source, thereby forming a TiN film. Finally, the $NH_3$ may be supplied to modify the grown film.

In addition, the formed film may be nitrified by supplying the $NH_3$ in the last step.

In addition, A Ti seed may be attached to the substrate by supplying the $TiCl_4$ at the beginning.

In addition, a case where the first processing gas such as the $TiCl_4$ and the second processing gas such as the $NH_3$ are supplied into the processing chamber 201 simultaneously has been described, but the expression "supplying the first processing gas and the second processing gas into a processing chamber simultaneously" should be thought of as meaning that at least some of supply times of respective gases overlap each other. More particularly, when the first processing gas and the second processing gas are supplied into the processing chamber, one processing gas may be first supplied in one direction, and the other processing gas may be continuously supplied in the other direction even after the supply of the one processing gas is stopped in the one direction. That is, the supply of the first processing gas and the supply of the second processing gas into the processing chamber may be performed or stopped at different time points.

Meanwhile, although the vertical apparatus has been generally illustrated as described above, the present invention is not limited to the vertical apparatus, but the present invention are also applicable to other apparatuses such as a single-type apparatus to form a TiN film using the CVD method. In addition, although the vertical thermal CVD apparatus has been generally illustrated as described above, the present invention is not limited to the vertical thermal CVD apparatus, but the present invention are also applicable to other apparatuses such as a plasma CVD apparatus and an optical CVD apparatus to form a TiN film using the CVD method.

[Preferred Embodiments of the Present Invention]

Hereinafter, preferred embodiments of the present invention will be now described in further detail.

(1) According to one embodiment of the present invention, there is provided a method of manufacturing a semiconductor device in which a film is formed on a substrate placed in a processing chamber by reaction of a modification gas with a source gas. Here, the method of manufacturing a semiconductor device includes a source gas exposure process for exposing the substrate to the source gas, and a modification gas exposure process for exposing the substrate to the modification gas, wherein one round of the source gas exposure process and two rounds of the modification gas exposure processes are performed as one cycle repeatedly a plurality of cycles.

(2) According to another embodiment of the present invention, there is provided a method of manufacturing a semiconductor device in which a film is formed on a substrate placed in a processing chamber by reaction of a modification gas with a source gas. Here, the method of manufacturing a semiconductor device includes a film-forming process of forming a film by exposing the substrate to the source gas and the modification gas simultaneously, a removal process of removing an atmosphere inside the processing chamber after the film-forming process, and a modification process of modifying the film formed on the substrate by exposing the substrate to the modification gas after the removal process.

(3) Preferably, the film-forming process, the removal process, and the modification process of (2) are performed as one cycle repeatedly a plurality of cycles until a film having a predetermined film thickness is formed on the substrate.

(4) Preferably, in the film-forming process of (2), a time taken to expose the substrate to the source gas is different from a time taken to expose the substrate to the modification gas.

(5) Preferably, in the film-forming process of (4), the time it takes to expose the substrate to the modification gas is set to a longer period than the time it takes to expose the substrate to the source gas.

(6) Preferably, in the film-forming process of (5), a film is deposited on the substrate by starting to expose the substrate to the source gas and the modification gas simultaneously point, and the film deposited on the substrate is modified by exposing the substrate to only the modification gas.

(7) Preferably, in the film-forming process of (5), after the substrate is exposed to only the modification gas, a film is deposited on the substrate by exposing the substrate to the modification gas and simultaneously exposing the substrate to the source gas, and the film deposited on the substrate is modified by exposing the substrate to only the modification gas.

(8) Preferably, in the film-forming process of (5), a film is formed on the substrate by exposing the substrate to only the source gas, and then exposing the substrate to the source gas and simultaneously exposing the substrate to the modification gas, and the substrate is then exposed to only the modification gas.

(9) Preferably, in the film-forming process of (2), at least some of the source gas is adsorbed onto the substrate by exposing the substrate to only the source gas, a film is then deposited onto the substrate by reaction with the source gas while at least some of the source gas adsorbed onto the substrate is being modified by exposing the substrate to the modification gas while exposing the substrate to the source gas, and the film deposited on the substrate is subsequently modified by exposing the substrate to only the modification gas.

(10) Preferably, in the film-forming process of (4), the time it takes to expose the substrate to the source gas is set to a longer period than the time it takes to expose the substrate to the modification gas.

(11) Preferably, in the film-forming process of (10), after the substrate is exposed to only the source gas, a film is formed on the substrate by exposing the substrate to the modification gas while exposing the substrate to the source gas, and the substrate is subsequently exposed to only the source gas.

(12) Preferably, in the film-forming process of (10), at least some of the source gas is adsorbed onto the substrate by exposing the substrate to only the source gas, a film is then deposited on the substrate by reaction with the source gas while at least some of the source gas adsorbed onto the substrate is modified by exposing the substrate to the modification gas while exposing the substrate to the source gas, and at least some of the source gas is subsequently adsorbed onto the substrate by exposing the substrate to only the source gas.

(13) According to still another embodiment of the present invention, there is provided a method of manufacturing a semiconductor device in which a film is formed on a substrate placed in a processing chamber by allowing a modification gas to react with a source gas. Here, the method of manufacturing a semiconductor device includes a deposition process of depositing a film by exposing the substrate to the source gas and the modification gas simultaneously, a removal process of removing an atmosphere inside the processing chamber after the deposition process, a modification process of modifying the film formed on the substrate by exposing the substrate to the modification gas, and a source adsorption process of adsorbing a source onto the substrate by exposing the substrate to the source gas.

(14) Preferably, in (13), at least one round of the deposition process, plural rounds of the removal process, at least one round of the modification process and at least one round of the source adsorption process are preformed as one cycle repeatedly a plurality of cycles until a film having a predetermined film thickness is formed on the substrate.

(15) According to yet another embodiment of the present invention, there is provided a method of manufacturing a semiconductor device in which a film is formed on a substrate placed in a processing chamber by allowing a modification gas to react with a source gas. Here, the method of manufacturing a semiconductor device includes a source gas exposure process of exposing the substrate to the source gas, a film-forming process of depositing a film while modifying the source gas adsorbed onto the substrate by exposing the substrate to the modification gas while exposing the substrate to the source gas after the source gas exposure process, a modification process of modifying the film deposited onto the substrate by exposing the substrate to the modification gas in a state where the exposure of the substrate to the source gas is stopped after the film-forming process, and a removal process of removing an atmosphere inside the processing chamber, wherein the source gas exposure process, the film-forming process, the modification process, and the removal process are performed in order repeatedly a predetermined number of times.

(16) According to yet another embodiment of the present invention, there is provided a method of manufacturing a semiconductor device in which a film is formed on a substrate placed in a processing chamber by allowing a modification gas to react with a source gas. Here, the method of manufacturing a semiconductor device includes a modification gas exposure process of exposing the substrate to the modification gas, a film-forming process of exposing the substrate to the source gas while exposing the substrate to the modification gas after the modification gas exposure process, a source gas exposure process of exposing the substrate to the source gas in a state where the exposure of the substrate to the modification gas is stopped after the film-forming process, and a removal process of removing an atmosphere inside the processing chamber, wherein the modification gas exposure process, the film-forming process, the source gas exposure process, and the removal process are performed in order repeatedly a predetermined number of times.

(17) Preferably, in the film-forming process of any of (2) through (12), (15) and (16), the modification gas is activated and the substrate is exposed thereto.

(18) Preferably, in the deposition process of (13) or (14), the modification gas is activated and the substrate is exposed thereto.

(19) Preferably, in (17) or (18), the modification gas is activated by plasma excitation.

(20) Preferably, in (17) or (18), the modification gas is activated by photo-excitation.

(21) Preferably, a semiconductor device manufactured using any of (1) through (20) is provided.

(22) According to yet another embodiment of the present invention, there is provided a substrate processing apparatus including a processing chamber for accommodating a substrate, a source gas supply system for supplying a source gas into the processing chamber, a modification gas supply system for supplying a modification gas into the processing chamber, an exhaust system for exhausting an atmosphere inside the processing chamber, and a control unit for controlling the source gas supply system, the modification gas supply system, and the exhaust system, wherein the control unit controls the source gas supply system, the modification gas supply system, and the exhaust system to form a film on the substrate by supplying the source gas and the modification gas into the processing chamber simultaneously, exhaust the atmosphere inside the processing chamber, and modify the film formed on the substrate by supplying the modification gas into the processing chamber.

(23) According to yet another embodiment of the present invention, there are provided a film-forming method and a film-forming apparatus for forming a TiN film on a substrate to be processed in which a conductive film, an insulation film or a conductive pattern separated by an insulation film is exposed by allowing any of an inorganic metal compound or an organometallic compound containing N (hereinafter, an N source) to react with any of an inorganic metal compound or an organometallic compound containing Ti (hereinafter, a Ti source), wherein the TiN film is periodically formed on the substrate to be processed by supplying the Ti source and the N source using a pulse.

(24) Preferably, in (23), one cycle of a film-forming sequence is composed of one pulse of the Ti source and two or more pulses of the N source.

(25) Preferably, in (23) or (24), when the N source flows simultaneously with the Ti source, a pulse of the Ti source and pulses of the N source are turned on simultaneously point, and the pulses of the N source are turned off after the pulse of the Ti source is turned off.

(26) Preferably, in (23) or (24), when the N source flows simultaneously with the Ti source, the pulse of the Ti source is turned on after the pulses of the N source are turned on, and the pulses of the N source are turned off after the pulse of the Ti source is turned off.

(27) Preferably, in (23) or (24), when the N source flows simultaneously with the Ti source, the pulses of the N source are turned on after the pulse of the Ti source is turned on, and the pulses of the N source are turned off after the pulse of the Ti source is turned off.

(28) Preferably, in (23) or (24), when the N source flows simultaneously with the Ti source, the pulses of the N source are turned on after the pulse of the Ti source is turned on, and the pulse of the Ti source is turned off after the pulses of the N source are turned off.

(29) Preferably, in (23), one cycle of a film-forming sequence is composed of two or more pulses of the Ti source and two or more pulses of the N source.

(30) Preferably, in (29), at least one pulse of each of the pulses of the Ti source and the pulses of the N source is configured to flow simultaneously during the one cycle of the film-forming sequence.

(31) Preferably, in the one cycle of the film-forming sequence of (23), there is a time zone at which the pulses of the Ti source and the N source are in an ON state simultaneously, only one of the pulses of the Ti source and the N source is in an ON state.

(32) Preferably, in (31), the Ti source is first turned on and the N source is then turned on, and the Ti source is turned off and the N source is then turned off

(33) Preferably, in (31), the Ti source is turned on after the N source is turned on, and the N source is turned off after the Ti source is turned off.

(34) Preferably, in any of (23) through (33), the Ti source is titanium tetrachloride.

(35) Preferably, in any of (23) through (33), the N source is ammonia.

(36) Preferably, in any of (23) through (33), plasma application and light irradiation are performed at a time point when the pulses of the Ti source and the N source are in an ON state simultaneously.

(37) Preferably, there are provided a film-forming apparatus, as the film-forming apparatus described in any one of (23) through (36), which is a batch furnace that can process a plurality of substrates to be processed simultaneously, and a film-forming method using the film-forming apparatus.

(38) Preferably, there are provided a film-forming apparatus, as the film-forming apparatus described in (37), including a vertical furnace body having a shape where the substrates to be processed are processed while overlapping each other in plural numbers in a longitudinal direction, and an inner tube arranged in a reaction tube and having nearly the same diameter as the substrates to be processed, wherein a gas is introduced and exhausted in a lateral direction between the substrates to be processed arranged inside the inner tube, and a film-forming method using the film-forming apparatus.

(39) Preferably, there are a single-type film-forming apparatus, as the film-forming apparatus described in any one of (23) through (36), that processes substrates to be processed one by one, and a film-forming method using the film-forming apparatus.

(40) According to yet another embodiment of the present invention, there is provided a method of manufacturing a semiconductor device including a substrate-loading process of loading a substrate into a processing chamber, a film-forming process of forming a predetermined film on the substrate by supplying the first processing gas and the second processing gas into the processing chamber simultaneously, a removal process of stopping the supply of the first processing gas and the second processing gas and removing the first processing gas and the second processing gas remaining in the processing chamber, a modification process of modifying the film formed on the substrate by supplying the second processing gas into the processing chamber after the removal process, and a substrate-unloading process of unloading the substrate from the processing chamber, wherein, in the film-forming process, a time taken to supply the second processing gas into the processing chamber is longer than a time taken to supply the first processing gas into the processing chamber.

(41) Preferably, in the film-forming process of (40), a film is formed on the substrate by starting to supply the first processing gas and the second processing gas into the processing chamber simultaneously, and the film formed on the substrate is then modified by supplying the second processing gas in a state where the supply of the first processing gas is stopped.

(42) Preferably, in the film-forming process of (41), a film is formed on the substrate by supplying the second processing gas into the processing chamber in a state where the supply of the first processing gas is stopped and subsequently supplying the first processing gas into the processing chamber simultaneously while supplying the second processing gas into the processing chamber, and the film formed on the substrate is modified by supplying the second processing gas into the processing chamber in a state where the supply of the first processing gas is stopped.

(43) Preferably, in the film-forming process of (41), a film is formed on the substrate by supplying the first processing gas into the processing chamber in a state where the supply of the second processing gas is stopped and subsequently supplying the second processing gas into the processing chamber while supplying the first processing gas into the processing chamber, and the film formed on the substrate is modified by supplying the second processing gas into the processing chamber in a state where the supply of the first processing gas is stopped.

(44) Preferably, in the film-forming process of (41), at least some of the first processing gas is adsorbed onto the substrate by supplying the first processing gas into the processing chamber in a state where the supply of the second processing gas is stopped, a film is then formed on the substrate by reaction with the first processing gas while modifying at least some of the first processing gas adsorbed onto the substrate by supplying the second processing gas into the processing chamber while supplying the first processing gas into the processing chamber, and the film formed on the substrate is modified by supplying the second processing gas into the processing chamber in a state where the supply of the first processing gas is stopped.

(45) According to yet another embodiment of the present invention, there is provided a method of manufacturing a semiconductor device including a substrate-loading process of loading a substrate into a processing chamber, a film-forming process of forming a predetermined film on the substrate by supplying the first processing gas and the second processing gas into the processing chamber simultaneously, a removal process of stopping the supply of the first processing gas and the second processing gas and removing the first processing gas and the second processing gas remaining in the processing chamber, a modification process of modifying the film formed on the substrate by supplying the second processing gas into the processing chamber, an adsorption process of stopping the supply of the second processing gas and adsorbing at least some of the second processing gas onto the substrate by supplying the first processing gas into the processing chamber, and a substrate-unloading process of unloading the substrate from the processing chamber.

(46) Preferably, in (45), at least one round of the film-forming process, plural rounds of the removal process, at least one round of the modification process, and at least one round of the adsorption process are performed as one cycle repeatedly a plurality of cycles until a film having a predetermined film thickness is formed on the substrate.

(47) According to yet another embodiment of the present invention, there is provided a method of manufacturing a semiconductor device including a substrate-loading process of loading a substrate into a processing chamber, an adsorption process of adsorbing a first element onto the substrate by supplying the first processing gas containing the first element into the processing chamber, a film-forming process of forming a predetermined film on the substrate by reaction with the first processing gas and the first element adsorbed onto the substrate by supplying the second processing gas containing a second element while supplying the first processing gas into the processing chamber, a modification process of modifying the film formed on the substrate by stopping the supply of the first processing gas and supplying the second processing gas into the processing chamber, a removal process of stopping the supply of the second processing gas and removing the first processing gas and the second processing gas remaining in the processing chamber, and a substrate-unloading process of unloading the substrate from the processing chamber, wherein the adsorption process, the film-forming process, the modification process, and the removal process are performed in order repeatedly a predetermined number of times.

(48) Preferably, in any of (40) through (47), the second processing gas is activated and supplied into the processing chamber.

(49) Preferably, in any of (40) through (47), the second processing gas is a nitrogen-containing gas or an oxygen-containing gas.

(50) Preferably, in (48), the second processing gas is activated by plasma excitation.

(51) Preferably, in (48), the second processing gas is activated by photo-excitation.

(52) According to yet another embodiment of the present invention, there is provided a method of manufacturing a semiconductor device including a first process of loading a substrate into a processing chamber, a second process of supplying the first processing gas into the processing chamber, a third process of supplying the second processing gas into the processing chamber while supplying the first processing gas into the processing chamber, a fourth process of stopping the supply of the first processing gas and supplying the second processing gas, a fifth process of stopping the supply of the second processing gas and removing the first processing gas and the second processing gas remaining in the processing chamber, and a sixth process of unloading the substrate from the processing chamber, wherein the first process through the sixth process are performed in order repeatedly a predetermined number of times.

(53) Preferably, a semiconductor manufactured by the method described in any of (40) through (52) is provided.

(54) According to yet another embodiment of the present invention, there is provided a substrate processing apparatus including a processing chamber for accommodating a substrate; the first processing gas supply means for supplying the first processing gas into the processing chamber; the second processing gas supply means for supplying the second processing gas into the processing chamber; an exhaust means for exhausting an inside of the processing chamber; and a control unit for controlling the first processing gas supply means, the second processing gas supply means, and the exhaust means to form a film on the substrate by supplying the first processing gas and the second processing gas into the processing chamber simultaneously, exhaust the first processing gas and the second processing gas remaining in the processing chamber by stopping the supply of the first processing gas and the second processing gas, and modify the film formed on the substrate by supplying the second processing gas into the processing chamber, wherein, when the first processing gas and the second processing gas are supplied into the processing chamber simultaneously, the control unit is configured to control the first processing gas supply means and the second processing gas supply means so that a time taken to supply the second processing gas into the processing chamber is longer than a time taken to supply the first processing gas into the processing chamber.

What is claimed is:

1. A method of manufacturing a semiconductor device, comprising:
   (a) loading a substrate into a processing chamber;
   (b) simultaneously starting a supply of a first processing gas and a second processing gas into the processing chamber to form a film on the substrate and simultaneously stopping the supply of the first processing gas and the second processing gas;
   (c) removing the first processing gas and the second processing gas remaining after performing the step (b) from the processing chamber;
   (d) supplying the second processing gas into the processing chamber without supplying the first processing gas;
   (e) removing the second processing gas remaining after performing the step (d) from the processing chamber;
   (f) starting and then stopping a supply of the first processing gas into the processing chamber without supplying the second processing gas;
   (g) removing the first processing gas remaining after performing the step (f) from the processing chamber; and
   (h) unloading the substrate from the processing chamber.

2. The method according to claim 1, wherein the steps (b) through (g) are performed in order a predetermined number of times to form a predetermined film.

3. The method according to claim 1, wherein the first processing gas includes a titanium-containing gas, the second processing gas includes a nitrogen-containing gas, and the film formed on the substrate includes a titanium nitride.

4. The method of according to claim 1, wherein the first processing gas includes a metal-containing gas.

5. A method of manufacturing a semiconductor device, comprising:
   (a) loading a substrate into a processing chamber;
   (b) starting a supply of a first processing gas containing a first element into the processing chamber and stopping the supply of the first processing gas without supplying a second processing gas containing a second element;
   (c) removing the first processing gas remaining after performing the step (b) from the processing chamber
   (d) simultaneously starting a supply of the first processing gas and the second processing gas into the processing chamber and simultaneously stopping the supply of the first processing gas and the second processing gas to react the second processing gas with the first processing gas;
   (e) removing the first processing gas and the second processing gas remaining after performing the step (d) from the processing chamber;
   (f) supplying the second processing gas into the processing chamber without supplying the first processing gas;
   (g) removing the second processing gas remaining after performing the step (f) from the processing chamber; and
   (h) unloading the substrate from the processing chamber.

6. The method according to claim 5, wherein the steps (b) through (g) are performed in order a predetermined number of times to form a predetermined film.

7. The method according to claim 5, wherein the first element includes titanium and the second element includes nitrogen.

8. The method according to claim 5, wherein the first processing gas includes a titanium-containing gas and the second processing gas includes a nitrogen-containing gas.

9. The method of according to claim 5, wherein the first processing gas includes a metal-containing gas.

* * * * *